US007920430B2

(12) United States Patent
Koebernik et al.

(10) Patent No.: US 7,920,430 B2
(45) Date of Patent: Apr. 5, 2011

(54) INTEGRATED CIRCUITS AND METHODS FOR OPERATING THE SAME USING A PLURALITY OF BUFFER CIRCUITS IN AN ACCESS OPERATION

(75) Inventors: Gert Koebernik, Unterhaching (DE); Jan Gutsche, Munich (DE); Christoph Friederich, Munich (DE); Detlev Richter, Munich (DE)

(73) Assignee: Qimonda AG, Munich (DE)

( * ) Notice: Subject to any disclaimer, the term of this patent is extended or adjusted under 35 U.S.C. 154(b) by 192 days.

(21) Appl. No.: 12/166,112

(22) Filed: Jul. 1, 2008

(65) Prior Publication Data

US 2010/0002503 A1 Jan. 7, 2010

(51) Int. Cl.
*G11C 7/10* (2006.01)

(52) U.S. Cl. ......... 365/189.05; 365/189.17; 365/189.08; 365/189.12; 365/185.03

(58) Field of Classification Search ............. 365/189.05, 365/189.17, 189.08, 189.12, 185.03
See application file for complete search history.

(56) References Cited

U.S. PATENT DOCUMENTS

| | | | | |
|---|---|---|---|---|
| 5,748,535 | A * | 5/1998 | Lin et al. | 365/185.22 |
| 5,754,469 | A * | 5/1998 | Hung et al. | 365/185.03 |
| 6,067,248 | A * | 5/2000 | Yoo | 365/185.03 |
| 7,085,160 | B2 * | 8/2006 | Shiga et al. | 365/185.17 |
| 7,242,611 | B2 * | 7/2007 | Fujisawa et al. | 365/185.03 |
| 7,366,014 | B2 * | 4/2008 | Micheloni et al. | 365/185.03 |
| 7,388,778 | B2 * | 6/2008 | Hwang | 365/185.03 |
| 7,499,332 | B2 * | 3/2009 | Crippa et al. | 365/185.22 |
| 7,558,148 | B2 * | 7/2009 | Sukegawa et al. | 365/230.09 |
| 7,577,029 | B2 * | 8/2009 | Pyeon | 365/185.03 |
| 7,639,529 | B2 * | 12/2009 | Park et al. | 365/185.03 |
| 7,688,634 | B2 * | 3/2010 | Richter et al. | 365/185.2 |

OTHER PUBLICATIONS

Park, K-T., et al., "A Zeroing Cell-to-Cell Interference Page Architecture with Temporary LSB Storing Program Scheme for Sub-40nm MLC NAND Flash Memories and beyond," 2007 Symposium on VLSI Circuits, Digest of Technical Papers, Jun. 14-16, 2007, pp. 188-189, IEEE.

Nobunaga, D., et al., "A 50nm 8Gb NAND Flash Memory with 100MB/s Program Throughput and 200MB/s DDR Interface," 2008 IEEE International Solid-State Circuits Conference, Digest of Technical Papers,Feb. 6, 2008, pp. 426-428, IEEE.

* cited by examiner

*Primary Examiner* — Viet Nguyen
(74) *Attorney, Agent, or Firm* — John S. Economou

(57) ABSTRACT

In an embodiment, an integrated circuit having a memory cell arrangement is provided. The memory cell arrangement may include a plurality of multiple bit information storing memory cells, a plurality of buffer circuits, each buffer circuit being coupled to at least one multiple bit information storing memory cell of the plurality of multiple bit information storing memory cells, and a controller configured to control an access operation to access at least one multiple bit information storing memory cell using the buffer circuit coupled to the at least one multiple bit information storing memory cell to be accessed, and a buffer circuit of at least one other multiple bit information storing memory cell being coupled to at least one other multiple bit information storing memory cell.

11 Claims, 15 Drawing Sheets

100
102
RAM
ROM
Processor
116
104
106
108
DSP
118
I/O Interface
I/O Interface
I/O Interface
110
112
114
134
126
128
Memory cell arrangement controller
Memory
130
132
122
120
124

124
126
206
Memory cells
204
208
210
202
212
214
216
218
126
130
220
132

300
322
312
316
326
308
302
330
328
324
306
310
314
320
318
304

A
400
210
210
206
402
404
406
408
204
424
420
422
206
418
426
204
410
412
414
416
428
426
430
426
432
426
434
426
436
A'
438
440
442

500
428
514
514
506
504
502
512
508
510
516
420
426

A
A'
600
602
604
606
608
636
638
640
642
206
210
204
610
612
614
616
618
620
622
624
626
628
630
632
634

...011
700
728
726
740
712
724
738
Cell to be programmed
742
710
722
736
708
720
734
706
718
732
LBL
704
716
730
702
714

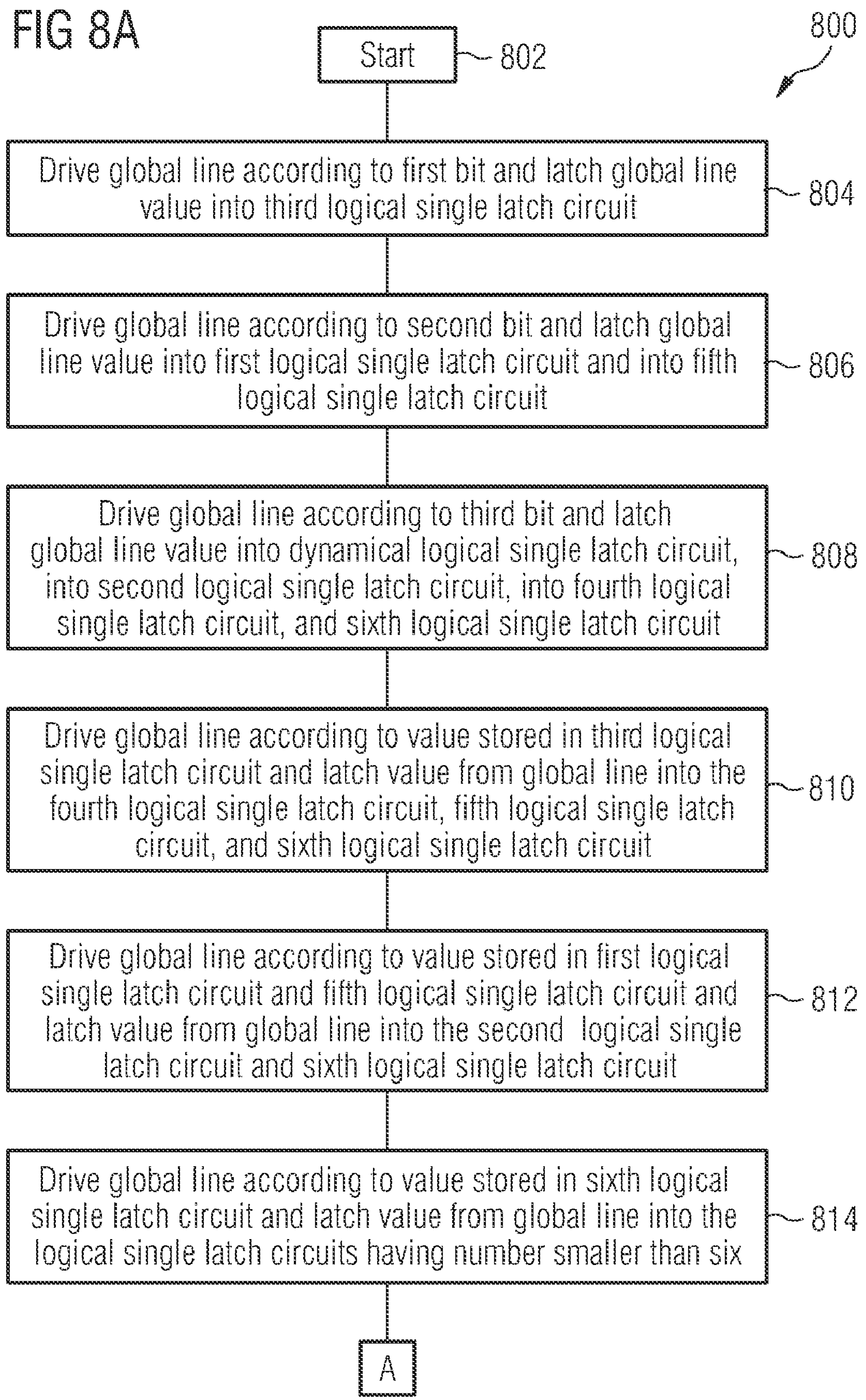
FIG 8A
800
Start
802
Drive global line according to first bit and latch global line value into third logical single latch circuit
804
Drive global line according to second bit and latch global line value into first logical single latch circuit and into fifth logical single latch circuit
806
Drive global line according to third bit and latch global line value into dynamical logical single latch circuit, into second logical single latch circuit, into fourth logical single latch circuit, and sixth logical single latch circuit
808
Drive global line according to value stored in third logical single latch circuit and latch value from global line into the fourth logical single latch circuit, fifth logical single latch circuit, and sixth logical single latch circuit
810
Drive global line according to value stored in first logical single latch circuit and fifth logical single latch circuit and latch value from global line into the second logical single latch circuit and sixth logical single latch circuit
812
Drive global line according to value stored in sixth logical single latch circuit and latch value from global line into the logical single latch circuits having number smaller than six
814
A

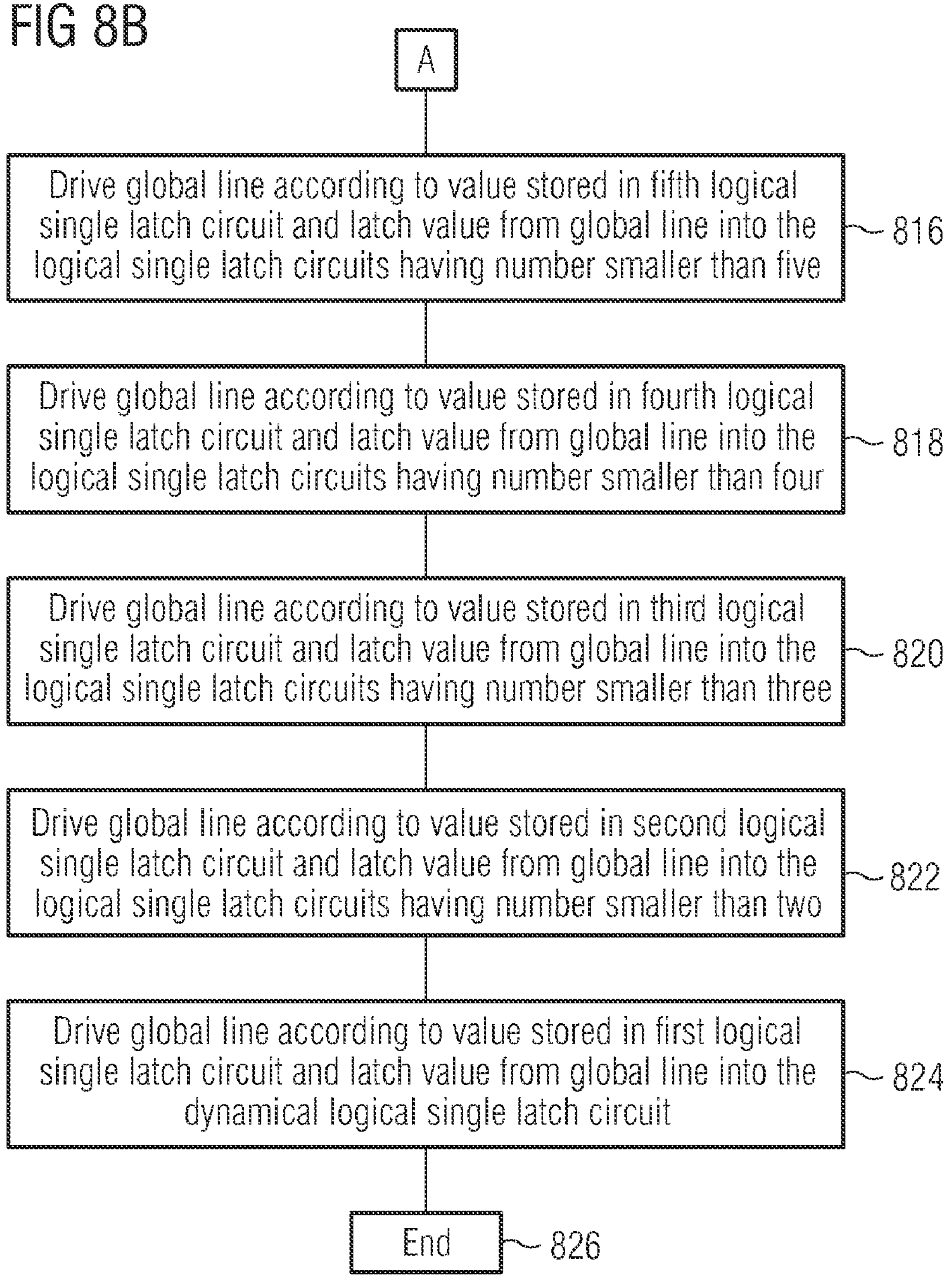
FIG 8B
A
Drive global line according to value stored in fifth logical single latch circuit and latch value from global line into the logical single latch circuits having number smaller than five
816
Drive global line according to value stored in fourth logical single latch circuit and latch value from global line into the logical single latch circuits having number smaller than four
818
Drive global line according to value stored in third logical single latch circuit and latch value from global line into the logical single latch circuits having number smaller than three
820
Drive global line according to value stored in second logical single latch circuit and latch value from global line into the logical single latch circuits having number smaller than two
822
Drive global line according to value stored in first logical single latch circuit and latch value from global line into the dynamical logical single latch circuit
824
End
826

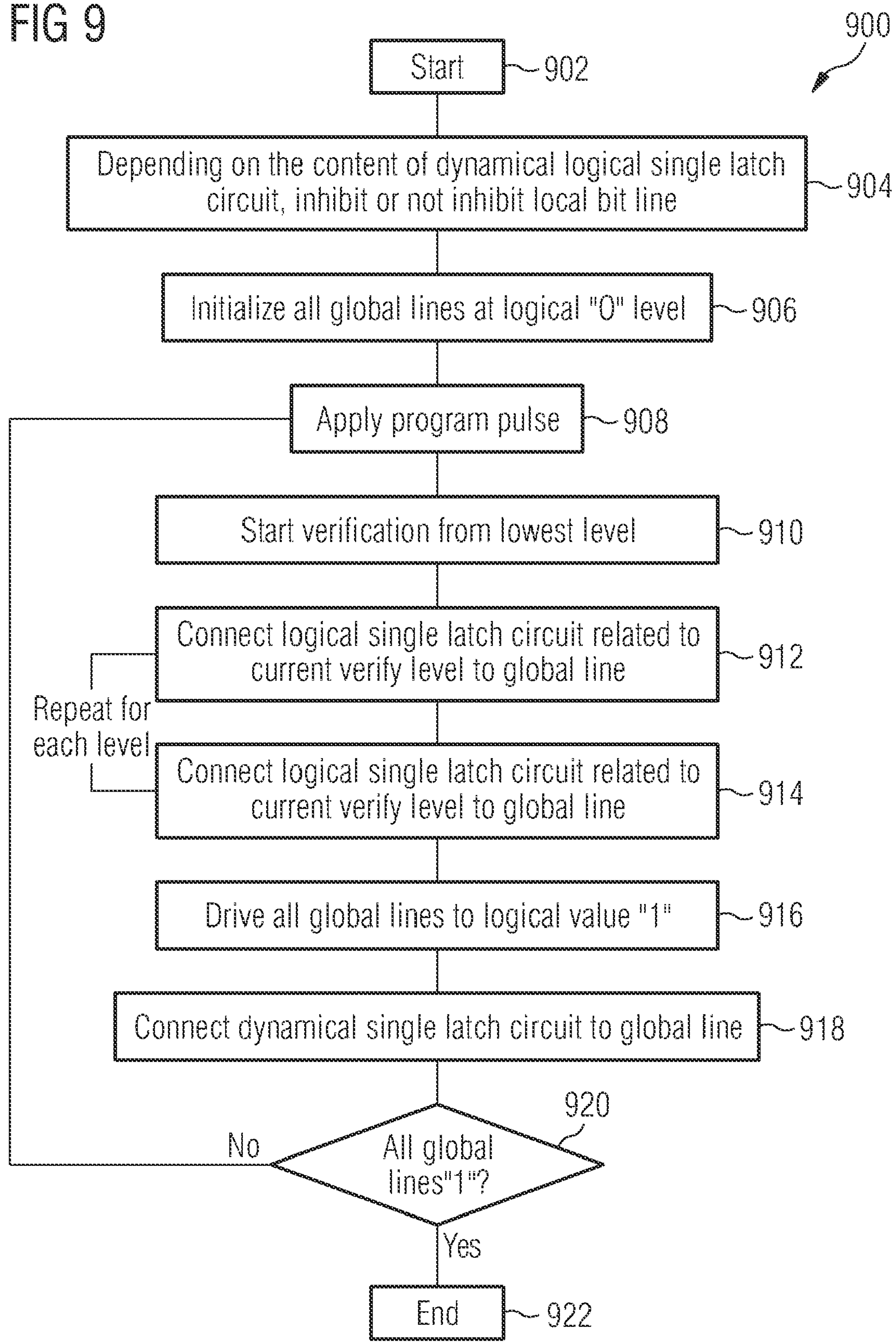
FIG 9
900
Start
902
Depending on the content of dynamical logical single latch circuit, inhibit or not inhibit local bit line
904
Initialize all global lines at logical "0" level
906
Apply program pulse
908
Start verification from lowest level
910
Connect logical single latch circuit related to current verify level to global line
912
Repeat for each level
Connect logical single latch circuit related to current verify level to global line
914
Drive all global lines to logical value "1"
916
Connect dynamical single latch circuit to global line
918
920
All global lines"1"?
No
Yes
End
922

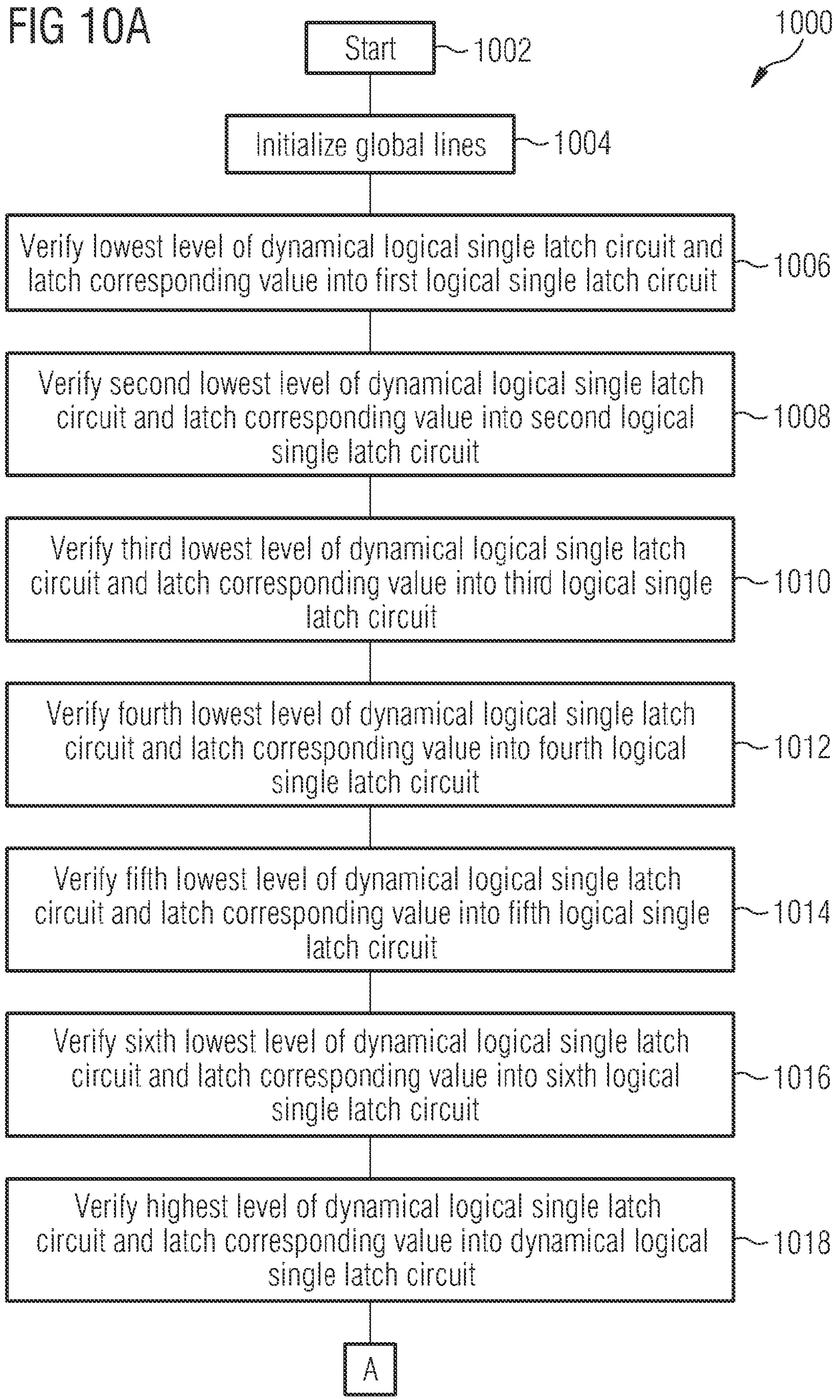
FIG 10A
1000
Start
1002
Initialize global lines
1004
Verify lowest level of dynamical logical single latch circuit and latch corresponding value into first logical single latch circuit
1006
Verify second lowest level of dynamical logical single latch circuit and latch corresponding value into second logical single latch circuit
1008
Verify third lowest level of dynamical logical single latch circuit and latch corresponding value into third logical single latch circuit
1010
Verify fourth lowest level of dynamical logical single latch circuit and latch corresponding value into fourth logical single latch circuit
1012
Verify fifth lowest level of dynamical logical single latch circuit and latch corresponding value into fifth logical single latch circuit
1014
Verify sixth lowest level of dynamical logical single latch circuit and latch corresponding value into sixth logical single latch circuit
1016
Verify highest level of dynamical logical single latch circuit and latch corresponding value into dynamical logical single latch circuit
1018
A

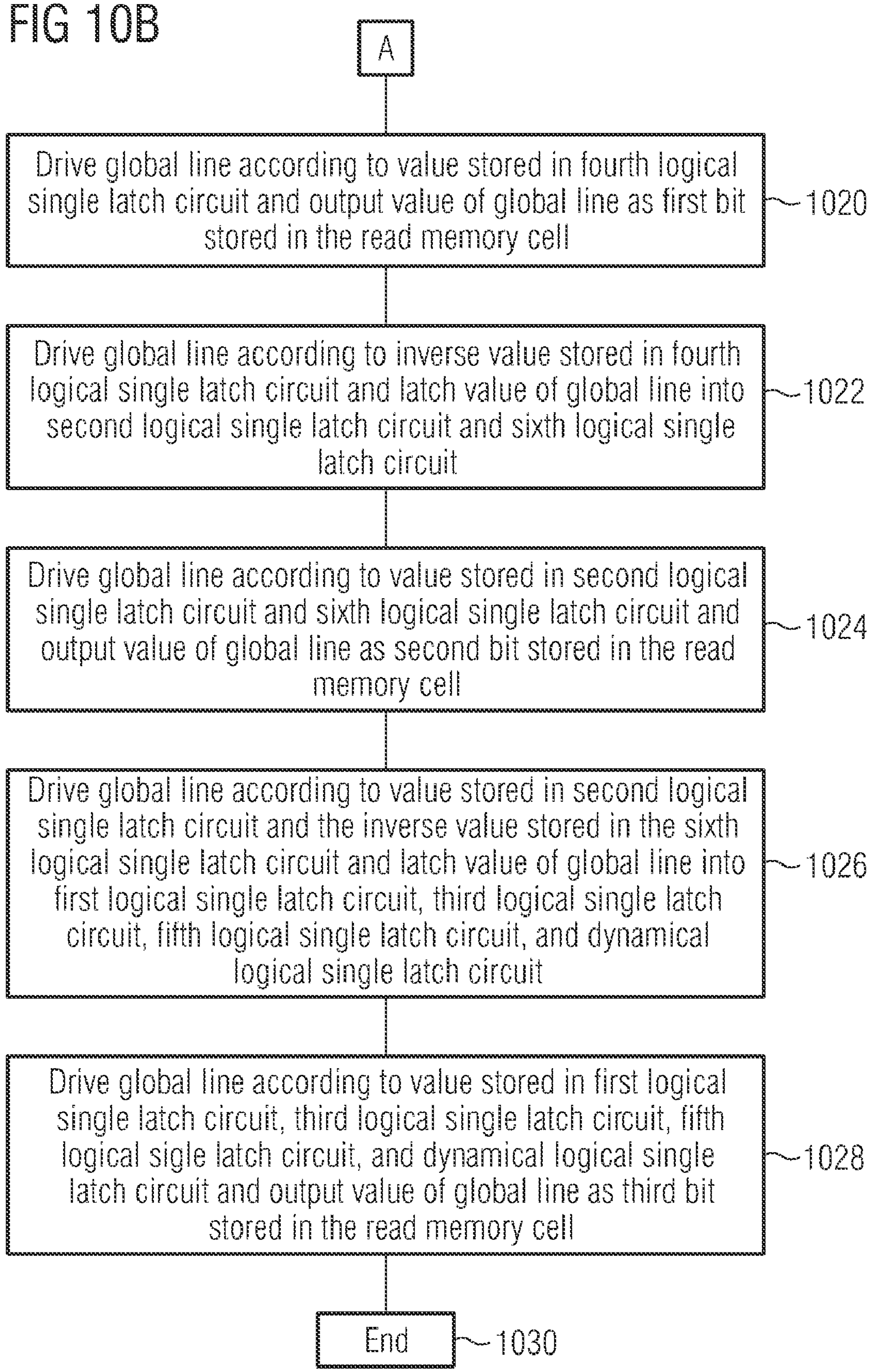
FIG 10B
A
Drive global line according to value stored in fourth logical single latch circuit and output value of global line as first bit stored in the read memory cell
1020
Drive global line according to inverse value stored in fourth logical single latch circuit and latch value of global line into second logical single latch circuit and sixth logical single latch circuit
1022
Drive global line according to value stored in second logical single latch circuit and sixth logical single latch circuit and output value of global line as second bit stored in the read memory cell
1024
Drive global line according to value stored in second logical single latch circuit and the inverse value stored in the sixth logical single latch circuit and latch value of global line into first logical single latch circuit, third logical single latch circuit, fifth logical single latch circuit, and dynamical logical single latch circuit
1026
Drive global line according to value stored in first logical single latch circuit, third logical single latch circuit, fifth logical sigle latch circuit, and dynamical logical single latch circuit and output value of global line as third bit stored in the read memory cell
1028
End
1030

1100
1104
Amplification circuit
1104
Amplification circuit
1104
Amplification circuit
1104
Amplification circuit
1102
1102
1102
1102
Shielding line
1106
Shielding line
1106
Shielding line
1106

1200
1210
1202
1204
1208
1212
1214
1206
amplification circuit 1300
1304
1306
1302
1308

1350
1352
1354
1356
1358
1360

INTEGRATED CIRCUITS AND METHODS FOR OPERATING THE SAME USING A PLURALITY OF BUFFER CIRCUITS IN AN ACCESS OPERATION

TECHNICAL FIELD

Embodiments relate generally to integrated circuits and to methods for operating the same using a plurality of buffer circuits in an access operation.

BACKGROUND

There is an ongoing demand in the manufacturing of NAND memory cell arrangements to shrink structures and to store more bits in each memory cell. Due to shrinking, the electrical resistance (R) and the electrical capacitance (C) of all global structures (such as, e.g., a global word line (WL) or a global bit line (BL)) is increasing. Furthermore, due to the desired increasing number of bits stored in one memory cell, the number of read operations and verify operations (e.g., to verify a level to be programmed into a memory cell) is growing drastically (~quadratic). Usually, the number of required programming pulses in a program operation is increasing in a linear manner with the number of memory cell levels to be programmed. For each verify operation (which is illustratively also a read operation) as well as for each programming pulse (due to inhibit), e.g., the global bit lines (GBL) have to be charged up.

During a read/verify operation, the GBL's have to be discharged through the memory cell strings (each memory cell string including a plurality of serially source-to-drain coupled memory cells) to achieve a detectable voltage drop on the respective GBL. The (maximum achievable) memory cell string current (at a given pass voltage) is reduced due to the shrinking and with the number of provided memory cells in a memory cell string. The pass voltage is limited due to read disturb reasons. The maximum allowed discharge current may only be a fraction of the achievable current, due to minimize back pattern effects (later on programmed bits in the same string will reduce the read current of the bit of interest due to its increased resistivity). Due to the fact that the "$V_t$" measurement (more generally the measurement of the memory cell's programming state) is performed by using a certain string current that causes a voltage drop on the corresponding bit line; this current reduction will be interpreted by the sensing scheme as a so-called $V_t$ shift and, when exceeding a read level, as a change of the memory cell's programming state. Thus, the used string current should be small due to accuracy reasons with respect to "back pattern". Therefore, the discharging time would increase to realize the same voltage drop on the bit line "BL". One way to address issues in terms of speed (R*C and discharge time ~C/string current) and power consumption would be to reduce the length of the GBL's (because the values of R and C are proportional to the length of the GBL's). However, in a conventional memory cell arrangement, on each (or on each second) GBL, there is connected one "Page buffer" (in the following also referred to as a page buffer circuit), that is latching and storing data of all levels in the memory cell related to it.

A page buffer circuit is a huge structure (e.g., for multi-level cell (MLC) devices), because each bit information (of at least one memory cell associated with this page buffer, for "pseudo block programming" and imprint of neighbored cells or more information or/and some soft information) must be somehow stored (e.g., in a latch of the page buffer circuit). From the perspective of array efficiency, as little space as possible required to implement the buffer circuits on the chip is desired (from a performance point of view, at least one page buffer circuit for each bit of a memory cell page is provided).

SUMMARY OF THE INVENTION

In an embodiment, an integrated circuit including a memory cell arrangement is provided. The memory cell arrangement may include a plurality of multiple bit information storing memory cells, a plurality of buffer circuits, each buffer circuit being coupled to at least one multiple bit information storing memory cell of the plurality of multiple bit information storing memory cells, and a controller configured to control an access operation to access at least one multiple bit information storing memory cell using the buffer circuit coupled to the at least one multiple bit information storing memory cell to be accessed, and a buffer circuit of at least one other multiple bit information storing memory cell being coupled to at least one other multiple bit information storing memory cell.

In another embodiment, an integrated circuit including a memory cell arrangement is provided. The memory cell arrangement may include a plurality of multiple bit information storing memory cells, a plurality of buffer circuits, each buffer circuit being coupled to at least one multiple bit information storing memory cell of the plurality of multiple bit information storing memory cells, and a controller configured to control an access operation to access at least one multiple bit information storing memory cell in a plurality of partial access operations, wherein data of a partial access operation of the access operation to access at least one multiple bit information storing memory cell is stored in at least one other buffer circuit being coupled to at least one other multiple bit information storing memory cell during another partial access operation of the access operation.

In yet another embodiment, an integrated circuit including a memory cell arrangement is provided. The memory cell arrangement may include a substrate, a plurality of NAND Flash memory cell segments on or in the substrate, each NAND Flash memory cell segment of the plurality of NAND Flash memory cell segments having a plurality of Flash memory cells and a plurality of buffer circuits, each buffer circuit being assigned to at least one NAND memory cell string of the NAND Flash memory cell segment, and at least one global control line. The at least one global control line is connected to page buffer circuits of different NAND Flash memory cell segments of the plurality of NAND Flash memory cell segments.

In yet another embodiment, a method for operating an integrated circuit having a memory cell arrangement is provided. The method may include carrying out an access operation to access at least one multiple bit information storing memory cell using a buffer circuit coupled to the at least one multiple bit information storing memory cell to be accessed, and, during the access operation, storing access operation information in a buffer circuit of at least one other multiple bit information storing memory cell being coupled to at least one other multiple bit information storing memory cell.

In yet another embodiment, a method for operating an integrated circuit having a memory cell arrangement is provided. The method may include controlling an access operation to access at least one multiple bit information storing memory cell in a plurality of partial access operations, wherein data of a partial access operation of the access operation to access at least one multiple bit information storing memory cell is stored in at least one other buffer circuit being coupled to at least one other multiple bit information storing memory cell during another partial access operation of the access operation.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments are described with reference to the following drawings, in which:

FIGS. 8A and 8B show a program flow diagram in accordance with an embodiment;

FIG. 9 shows a program and verify flow diagram in accordance with an embodiment;

FIGS. 10A and 10B show a read flow diagram in accordance with an embodiment;

DETAILED DESCRIPTION OF ILLUSTRATIVE EMBODIMENTS

Figure 1:
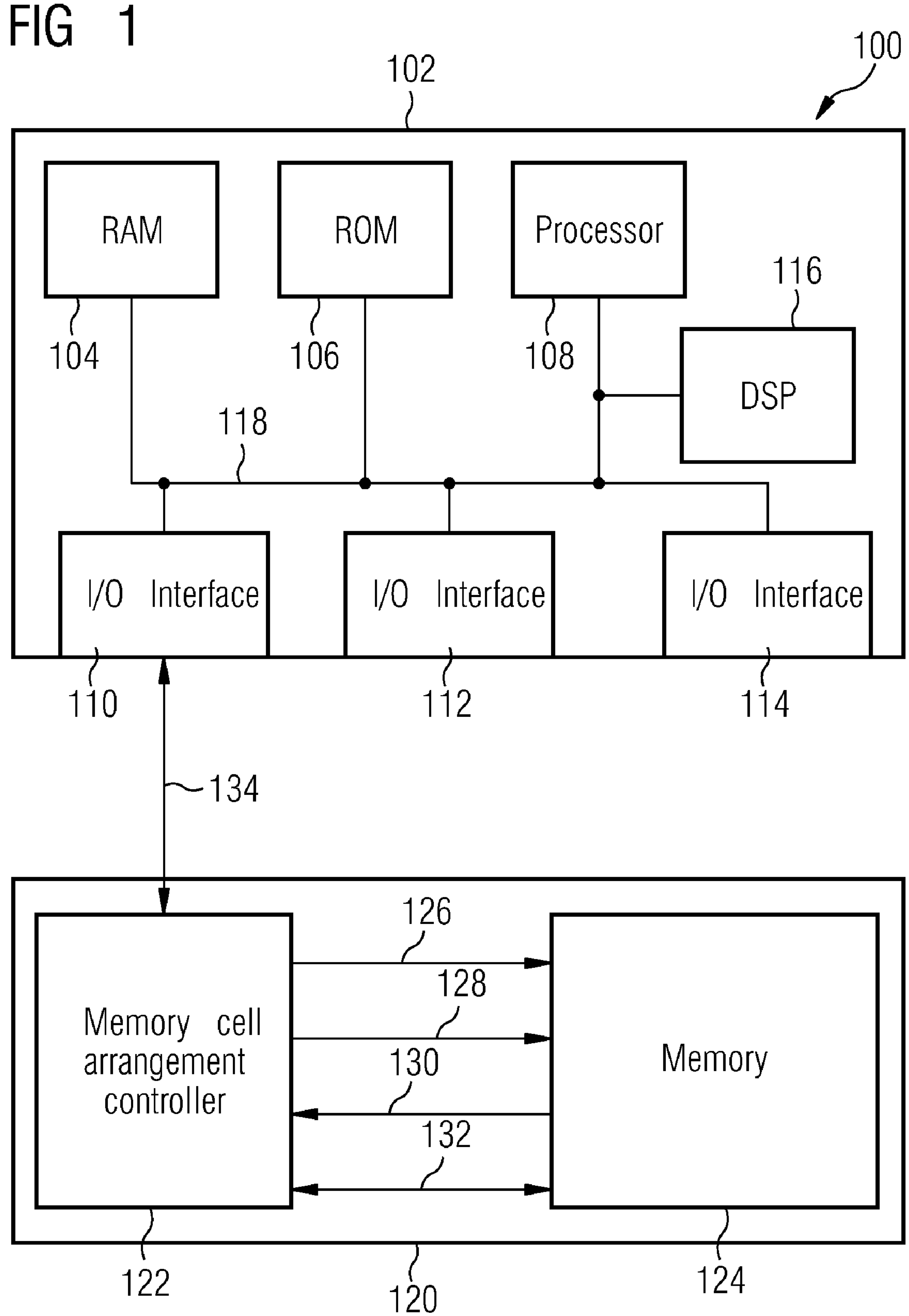
FIG. 1 shows a computer system having a memory cell arrangement in accordance with an embodiment.

FIG. 1 shows a computer system 100 having a computer arrangement 102 and a memory cell arrangement 120 in accordance with an embodiment.

In various embodiments, the computer arrangement 102 may be configured as or may include any device having a processor, e.g. having a programmable processor such as, e.g., a microprocessor (e.g., a CISC (complex instruction set computer) microprocessor or a RISC (reduced instruction set computer) microprocessor). In various embodiments, the computer arrangement 102 may be configured as or may include a personal computer, a workstation, a laptop, a notebook, a personal digital assistant (PDA), a radio telephone (e.g., a wireless radio telephone or a mobile radio telephone), a camera (e.g., an analog camera or a digital camera), a navigation system, or another device having a processor (such as, e.g., a household appliance (such as, e.g., a washing machine, a dishwashing machine, etc.))

In an embodiment, the computer arrangement 102 may include one or a plurality of computer arrangement-internal random access memories (RAM) 104, e.g., one or a plurality of computer arrangement-internal dynamic random access memories (DRAM), in which, for example, data to be processed may be stored. Furthermore, the computer arrangement 102 may include one or a plurality of computer arrangement-internal read only memories (ROM) 106, in which, for example, the program code may be stored, which should be executed by a processor 108 (e.g., a processor as described above), which may also be provided in the computer arrangement 102.

Furthermore, in an embodiment, one or a plurality of input/output interfaces 110, 112, 114 (in FIG. 1, there are shown three input/output interfaces, in alternative embodiments, e.g., one, two, four, or even more than four input/output interfaces may be provided) configured to connect one or a plurality of computer arrangement-external devices (such as, e.g., additional memory, one or a plurality of communication devices, one or a plurality of additional processors) to the computer arrangement 102, may be provided in the computer arrangement 102.

The input/output interfaces 110, 112, 114 may be implemented as analog interfaces and/or as digital interfaces. The input/output interfaces 110, 112, 114 may be implemented as serial interfaces and/or as parallel interfaces. The input/output interfaces 110, 112, 114 may be implemented as one or a plurality of circuits, which implements or implement a respective communication protocol stack in its functionality in accordance with the communication protocol which is respectively used for data transmission. Each of the input/output interfaces 110, 112, 114 may be configured in accordance with any communication protocol. In an embodiment, each of the input/output interfaces 110, 112, 114 may be implemented in accordance with one of the following communication protocols:

an ad hoc communication protocol such as, e.g., Firewire or Bluetooth;

a communication protocol for a serial data transmission such as, e.g., RS-232, Universal Serial Bus (USB) (e.g., USB 1.0, USB 1.1, USB 2.0, USB 3.0);

any other communication protocol such as, e.g., Infrared Data Association (IrDA).

In an embodiment, the first input/output interface 110 is a USB interface (in alternative embodiments, the first input/output interface 110 may be configured in accordance with any other communication protocol such as, e.g., in accordance with a communication protocol which has been described above).

In an embodiment, the computer arrangement 102 optionally may include an additional digital signal processor (DSP) 116, which may be provided, e.g., for digital signal processing. Furthermore, the computer arrangement 102 may include additional communication modules (not shown) such as, e.g., one or a plurality of transmitters, one or a plurality of receivers, one or a plurality of antennas, and so on.

The computer arrangement 102 may also include additional components (not shown), which are desired or required in the respective application.

In an embodiment, some or all of the circuits or components provided in the computer arrangement 102 may be coupled with each other by means of one or a plurality of computer arrangement-internal connections 118 (for example, by means of one or a plurality of computer busses) configured to transmit data and/or control signals between the respectively coupled circuits or components.

Furthermore, as has been described above, the computer system 100, in accordance with an embodiment, may include the memory cell arrangement 120.

The memory cell arrangement 120 may in an embodiment be configured as an integrated circuit. The memory cell arrangement 120 may further be provided in a memory module having a plurality of integrated circuits, wherein at least one integrated circuit of the plurality of integrated circuits includes a memory cell arrangement 120, as will be described in more detail below. The memory module may be a stackable memory module, wherein some of the integrated circuit may be stacked one above the other. In an embodiment, the memory cell arrangement 120 is configured as a memory card.

In an embodiment, the memory cell arrangement 120 may include a memory cell arrangement controller 122 (for example, implemented by means of hard wired logic and/or by means of one or a plurality of programmable processors, e.g., by means of one or a plurality of programmable processors such as, e.g., one or a plurality of programmable microprocessors (e.g. CISC (complex instruction set computer) microprocessor(s) or RISC (reduced instruction set computer) microprocessor(s)).

The memory cell arrangement 120 may further include a memory 124 having a plurality of memory cells. The memory 124 will be described in more detail below.

In an embodiment, the memory cell arrangement controller 122 may be coupled with the memory 124 by means of various connections. Each of the connections may include one or a plurality of lines and may thus have a bus width of one or a plurality of bits. Thus, by way of example, an address bus 126 may be provided, by means of which one or a plurality of addresses of one or a plurality of memory cells may be provided by the memory cell arrangement controller 122 to the memory 124, on which an operation (e.g., an erase operation, a write operation, a read operation, an erase verify operation, or a write verify operation, etc.) should be carried out. Furthermore, a data write connection 128 may be provided, by means of which the information to be written into the respectively addressed memory cell may be supplied by the memory cell arrangement controller 122 to the memory 124. Furthermore, a data read connection 130 may be provided, by means of which the information stored in the respectively addressed memory cell may be read out of the memory 124 and may be supplied from the memory 124 to the memory cell arrangement controller 122 and via the memory cell arrangement controller 122 to the computer arrangement 102, or, alternatively, directly to the computer arrangement 102 (in which case the first input/output interface 110 would directly be connected to the memory 124). A bidirectional control/state connection 132 may be used for providing control signals from the memory cell arrangement controller 122 to the memory 124 or for supplying state signals representing the state of the memory 124 from the memory 124 to the memory cell arrangement controller 122.

In an embodiment, the memory cell arrangement controller 122 may be coupled to the first input/output interface 110 by means of a communication connection 134 (e.g., by means of a USB communication connection).

In an embodiment, the memory 124 may include one chip or a plurality of chips. Furthermore, the memory cell arrangement controller 122 may be implemented on the same chip (or die) as the components of the memory 124 or on a separate chip (or die).

Figure 2:
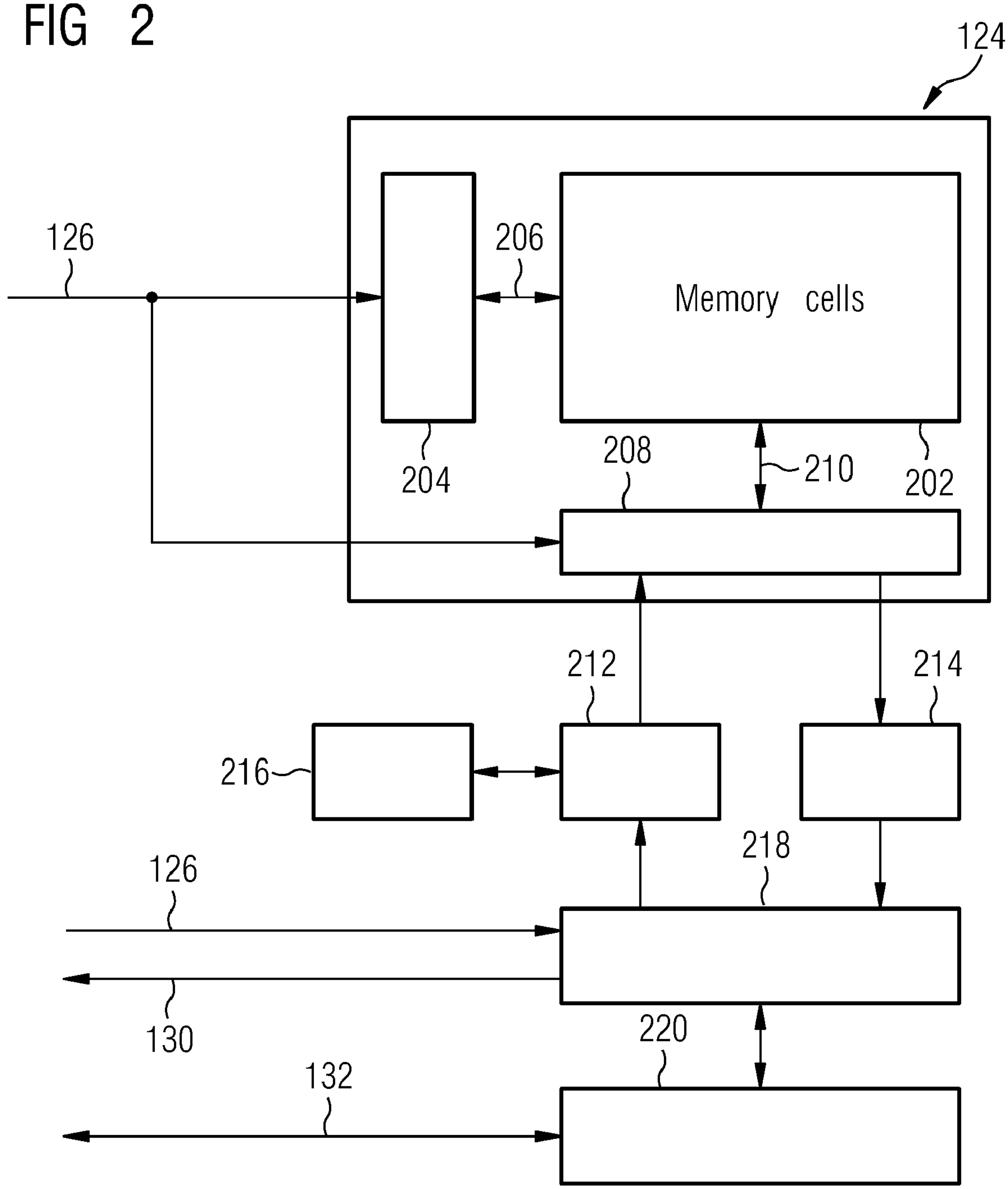
FIG. 2 shows a memory in accordance with an embodiment.

FIG. 2 shows the memory 124 of FIG. 1 in accordance with an embodiment in more detail.

In an embodiment, the memory 124 may include a memory cell field (e.g., a memory cell array) 202 having a plurality of memory cells. The memory cells may be arranged in the memory cell field 202 in the form of a matrix in rows and columns, or, alternatively, for example, in zig zag form. In other embodiments, the memory cells may be arranged within the memory cell field 202 in any other manner or architecture.

In general, each memory cell may, for example, be coupled with a first control line (e.g., a word line) and with at least one second control line (e.g., at least one bit line).

In an embodiment, in which the memory cells are arranged in the memory cell field 202 in the form of a matrix in rows and columns, a row decoder circuit 204 configured to select at least one row control line (e.g., a word line) of a plurality of row control lines 206 in the memory cell field 202 may be provided as well as a column decoder circuit 208 configured to select at least one column control line (e.g., a bit line) of a plurality of column control lines 210 in the memory cell field 202.

In an embodiment, the memory cells are non-volatile memory cells.

A "non-volatile memory cell" may be understood as a memory cell storing data even if it is not active. In an embodiment, a memory cell may be understood as being not active, e.g., if currently access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs.

The non-volatile memory cells may be memory cells selected from a group of memory cells consisting, e.g., of:

charge storing random access memory cells (e.g., floating gate memory cells or charge trapping memory cells);

magnetoresistive random access memory cells (MRAM);

phase change random access memory cells (PCRAM, for example, so called Ovonic Unified Memory (OUM) cells);

conductive filament random access memory cells (e.g., conductive bridging random access memory cells (CBRAM), also referred to as programmable metallization cells (PMC), or carbon-based conductive filament random access memory cells);

organic random access memory cells (ORAM);

nanotube random access memory cells (NRAM) (e.g., carbon nanotube random access memory cells);

nanowire random access memory cells.

In alternative embodiments, also other types of non-volatile memory cells may be used.

In various embodiments, the memory cells may be resistive memory cells.

Furthermore, the memory cells may be electrically erasable read only memory cells (EEPROM).

In an embodiment, the memory cells may be Flash memory cells, e.g., charge storing memory cells such as, e.g., floating gate memory cells or charge trapping memory cells.

In an embodiment, each charge trapping memory cell includes a charge trapping layer structure for trapping electrical charge carriers. The charge trapping layer structure may include one or a plurality of two separate charge trapping regions. In an embodiment, the charge trapping layer structure includes a dielectric layer stack including at least one dielectric layer or at least two dielectric layers being formed above one another, wherein charge carriers can be trapped in at least one dielectric layer. By way of example, the charge trapping layer structure includes a charge trapping layer, which may include or consist of one or more materials being selected from a group of materials that consists of: aluminum oxide ($Al_2O_3$), yttrium oxide ($Y_2O_3$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminium, zirconium and oxygen (AlZrO). In one embodiment, the charge trapping layer structure includes a dielectric layer stack including three dielectric layers being formed above one another, e.g., a first oxide layer (e.g., silicon oxide), a nitride layer as charge trapping layer (e.g., silicon nitride) on the first oxide layer, and a second oxide layer (e.g., silicon oxide or aluminum oxide) on the nitride layer. This type of dielectric layer stack is also referred to as ONO layer stack. In an alternative embodiment, the charge trapping layer structure includes two, four or even more dielectric layers being formed above one another.

In an embodiment, the memory cells may be multiple bit information storing memory cell such as, e.g., multi-bit memory cells or multi-level memory cells.

As used herein the term "multi-bit" memory cell is intended to, e.g., include memory cells which are configured to store a plurality of bits by spatially separated electric charge storage regions or current conductivity regions, thereby representing a plurality of logic states.

As used herein the term "multi-level" memory cell is intended to, e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

In an embodiment, address signals are supplied to the row decoder circuit 204 and the column decoder circuit 208 by means of the address bus 126, which is coupled to the row decoder circuit 204 and to the column decoder circuit 208. The address signals uniquely identify at least one memory cell to be selected for an access operation (e.g., for one of the above described operations). The row decoder circuit 204 selects at least one row and thus at least one row control line 206 in accordance with the supplied address signal. Furthermore, the column decoder circuit 208 selects at least one column and thus at least one column control line 210 in accordance with the supplied address signal.

The electrical voltages that are provided in accordance with the selected operation, e.g., for reading, programming (e.g., writing) or erasing of one memory cell or of a plurality of memory cells, are applied to the selected at least one row control line 206 and to the at least one column control line 210.

In the case that each memory cell is configured in the form of a field effect transistor (e.g. in the case of a charge storing memory cell), in an embodiment, the respective gate terminal is coupled to the row control line 206 and a first source/drain terminal is coupled to a first column control line 210. A second source/drain terminal may be coupled to a second column control line 210, alternatively, with a first source/drain terminal of an adjacent memory cell, which may then, e.g., also be coupled to the same column control line 210 (this is the case, e.g., in a NAND arrangement of the memory cells in the memory cell field 202).

In an embodiment, by way of example, for reading or for programming, a single row control line 206 and a single column control line 210 are selected at the same time and are appropriately driven for reading or programming of the thus selected memory cell. In an alternative embodiment, it may be provided to respectively select a single row control line 206 and a plurality of column lines 210 at the same time for reading or for programming, thereby allowing to read or program a plurality of memory cells at the same time.

Furthermore, in an embodiment, the memory 124 includes at least one write buffer memory 212 and at least one read buffer memory 214. The at least one write buffer memory 212 and the at least one read buffer memory 214 are coupled with the column decoder circuit 208. Depending on the type of memory cell, reference memory cells 216 may be provided for reading the memory cells.

In order to program (e.g., write) a memory cell, the data to be programmed may be received by a data register 218, which is coupled with the data write connection 128, by means of the data write connection 128, and may be buffered in the at least one write buffer memory 212 during the write operation.

In order to read a memory cell, the data read from the addressed memory cell (represented, e.g., by means of an electrical current, which flows through the addressed memory cell and the corresponding column control line 210, which may be compared with a current threshold value in order to determine the content of the memory cell, wherein the current threshold value may, e.g., be dependent from the reference memory cells 216) are, e.g., buffered in the read buffer memory 214 during the read operation. The result of the comparison and therewith the logic state of the memory cell (wherein the logic state of the memory cell represents the memory content of the memory cell) may then be stored in the data register 218 and may be provided via the data read connection 130, with which the data register 218 may be coupled.

The access operations (e.g., write operations, read operations, or erase operations) may be controlled by a memory-internal controller 220, which in turn may be controlled by the memory cell arrangement controller 122 by means of the bidirectional control/state connection 132. In an alternative embodiment, the data register 218 may directly be connected to the memory cell arrangement controller 122 by means of the bidirectional control/state connection 132 and thus directly controlled thereby. In this example, the memory-internal controller 220 may be omitted.

In an embodiment, the memory cells of the memory cell field may be grouped into memory blocks or memory sectors, which may be commonly erased in an erase operation. In an embodiment, there are so many memory cells included in a memory block or memory sector such that the same amount of data may be stored therein as compared with a conventional hard disk memory sector (e.g., 512 byte), although a memory block or memory sector may alternatively also store another amount of data.

Furthermore, other common memory components (e.g., peripheral circuits such as, e.g., charge pump circuits, etc.) may be provided in the memory 124, but they are neither shown in FIG. 1 nor FIG. 2 for reasons of clarity.

Figure 3:
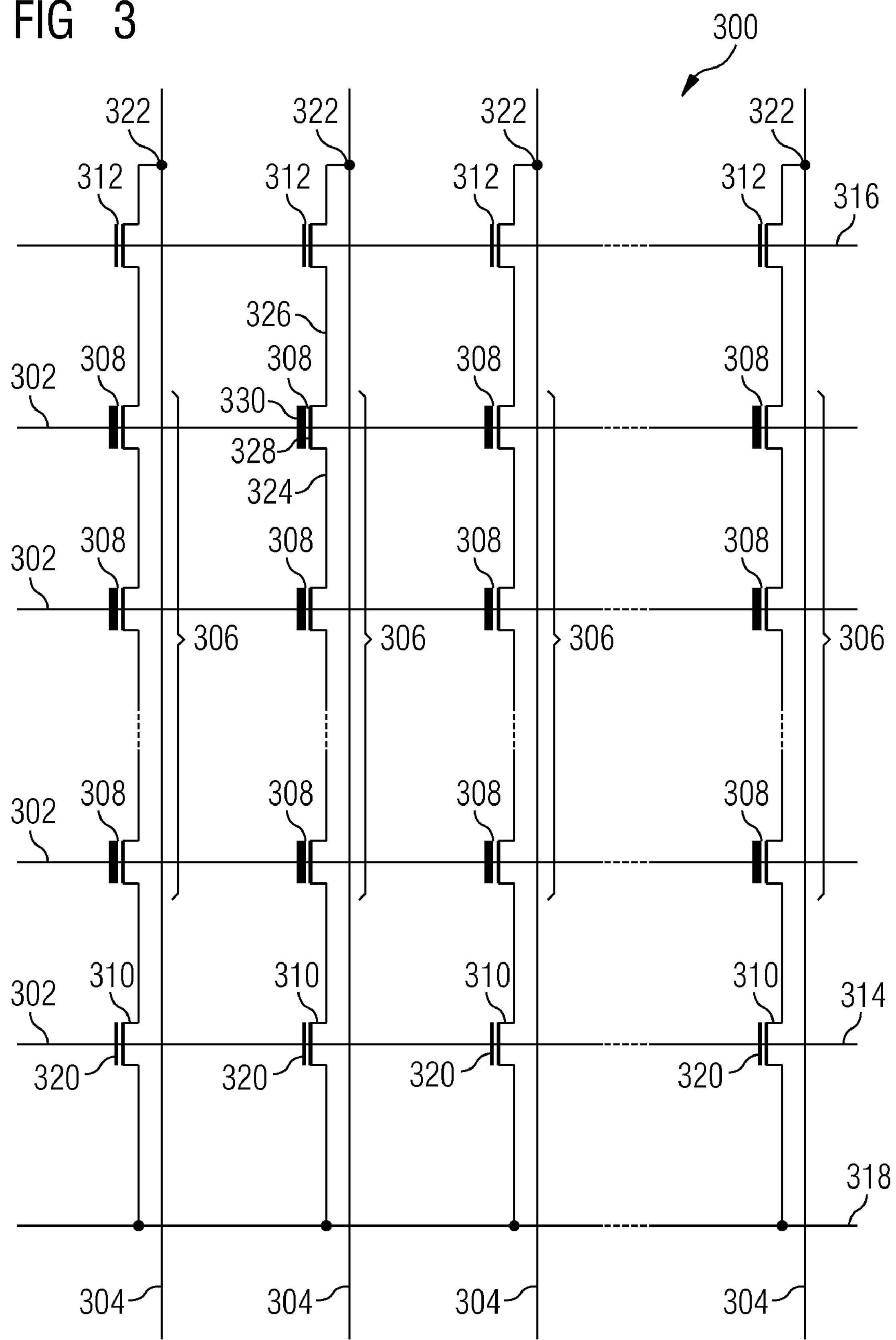
FIG. 3 shows an example portion of the memory cell field of FIG. 2 in accordance with an embodiment.

FIG. 3 shows a memory cell portion 300 of the memory cell field 202 in accordance with an embodiment.

In one embodiment, the memory cell portion 300 is arranged as a NAND memory cell field (although another coupling architecture may be provided in an alternative embodiment).

In an embodiment, the NAND memory cell portion 300 (e.g., a NAND memory cell array portion 300) may include word lines 302 (in general, an arbitrary number of word lines 302, in one embodiment, 1024 word lines 302) and intersecting bit lines 304 (in general, an arbitrary number of bit lines 304, in one embodiment, 512 bit lines 304).

The NAND memory cell array portion 300 may include NAND strings 306, each NAND string 306 having memory cells 308 (e.g., charge storing memory cells 308 such as, e.g., charge trapping memory cells 308 or floating gate memory cells 308). Furthermore, an arbitrary number of memory cells 308 can be provided in the NAND string 306, in accordance with one embodiment, 32 memory cells 308. The memory cells 308 are connected in series source-to-drain between a source select gate 310, which may be implemented as a field effect transistor, and a drain select gate 312, which may also be implemented as a field effect transistor. Each source select gate 310 is positioned at an intersection of a bit line 304 and a source select line 314. Each drain select gate 312 is positioned at an intersection of a bit line 304 and a drain select line 316. The drain of each source select gate 310 is connected to the source terminal of the first charge trapping memory cells 308 of the corresponding NAND string 306. The source of each source select gate 310 is connected to a common source line 318. A control gate 320 of each source select gate 310 is connected to the source select line 314.

In one embodiment, the common source line 318 is connected between source select gates 310 for NAND strings 306 of two different NAND arrays. Thus, the two NAND arrays share the common source line 318.

In an embodiment, the drain of each drain select gate 312 may be connected to the bit line 304 of the corresponding NAND string 306 at a drain contact 322. The source of each drain select gate 312 is connected to the drain of the last charge trapping memory cell 308 of the corresponding NAND string 306. In one embodiment, at least two NAND strings 306 share the same drain contact 322.

In accordance with the described embodiments, each memory cell 308 may include a source 324 (e.g., a first source/drain region), a drain 326 (e.g., a second source/drain region), a charge storage region 328 (e.g., a floating gate stack or a dielectric layer stack) and a control gate 330 (e.g., a gate region). The control gate 330 of each memory cell 308 may be connected to a respective word line 302. A column of the NAND memory cell array portion 300 may include a respective NAND string 306 and a row of the NAND memory cell array portion 300 may include those memory cells 308 that are commonly connected to a respective word line 302.

In an alternative embodiment, the memory cell portion 300 is a NOR memory cell array portion 300. In yet another embodiment, the memory cell portion 300 may be arranged in accordance with any other suitable architecture.

Figure 4:
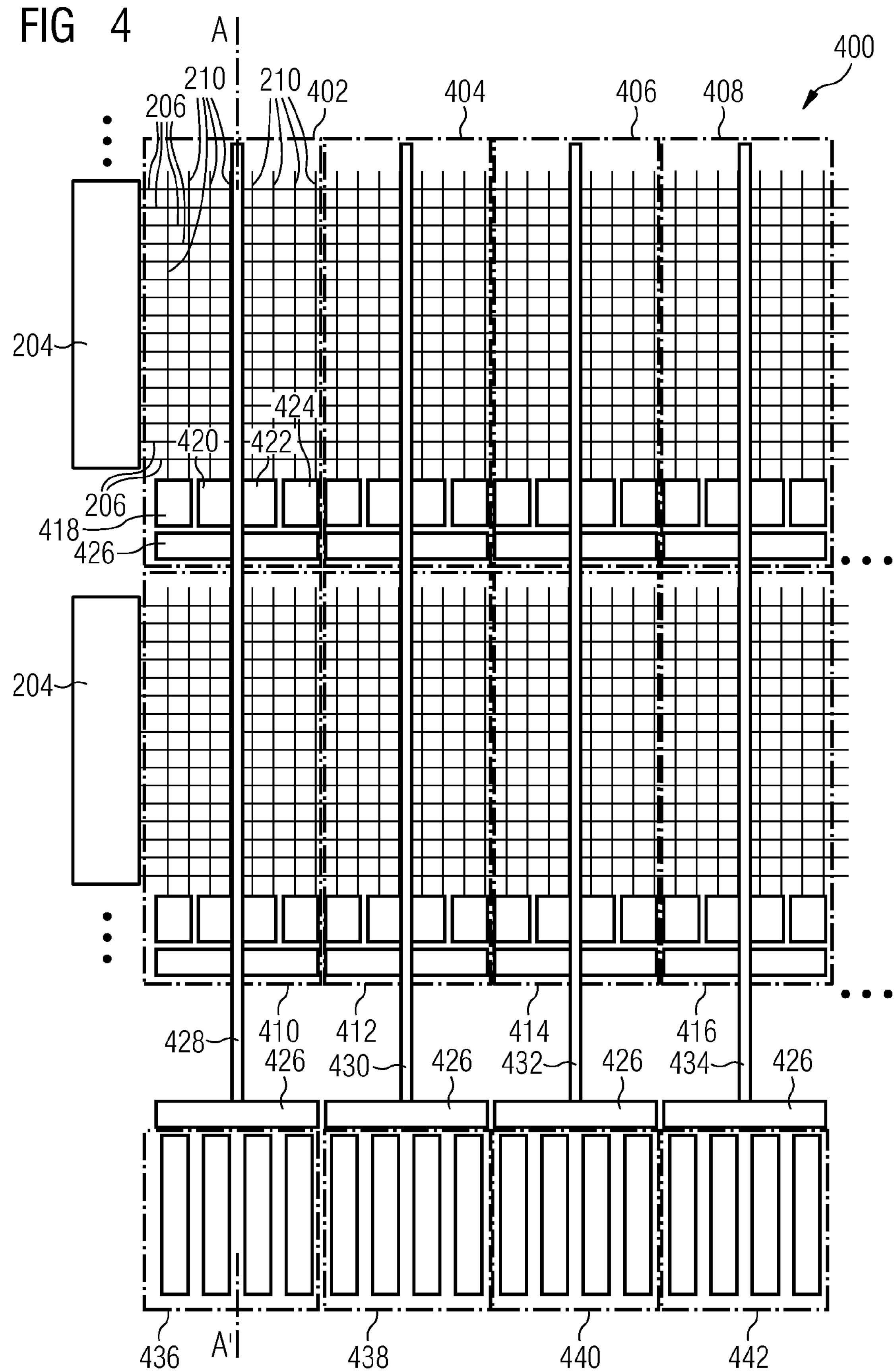
FIG. 4 shows a top view of an example portion of the memory of FIG. 2 in accordance with an embodiment.

FIG. 4 shows a top view of a memory cell portion 400 of the memory 124 in accordance with an embodiment including the row decoder circuit 204.

As shown in FIG. 4, in an embodiment, the memory cell field (e.g. the NAND memory cell field) 202 includes a plurality of memory cell segments 402, 404, 406, 408, 410, 412, 414, 416, eight of which are shown in FIG. 4 (in general, an arbitrary number of memory cell segments may be provided in the memory cell field (e.g. the NAND memory cell field) 202). In an implementation, all memory cell segments 402, 404, 406, 408, 410, 412, 414, 416, may have the identical structure.

By way of example, each memory cell segment 402, 404, 406, 408, 410, 412, 414, 416, may include a plurality of memory cells, which may be grouped and coupled in a plurality of NAND memory cell strings (e.g., as described above with reference to FIG. 3).

Furthermore, each memory cell segment 402, 404, 406, 408, 410, 412, 414, 416, may include a plurality of local page buffer circuits 418, 420, 422, 424 (in the following also referred to as segment page buffer circuits 418, 420, 422, 424), wherein each segment page buffer circuit 418, 420, 422, 424, may be assigned to one or more (e.g., two, three, four or even more) memory cell pages of the (each memory cell page may include one or a plurality of memory cell strings) memory cell segment 402, 404, 406, 408, 410, 412, 414, 416. In an embodiment, a memory cell page may be understood as a group of memory cells, which are coupled with the same row control line (e.g., with the same word line) 206 (it is to be noted that in an example, a memory cell page may include only a portion of those memory cells which are coupled with the same row control line (e.g., with the same word line) 206). As will be described in more detail below, each segment page buffer circuit 418, 420, 422, 424, may include an analog-to-digital converter (e.g., a sense amplifier or a latch) and at least one data storing element (e.g., one or more capacitor based volatile memory elements (e.g., dynamic random access memory (DRAM) elements) or one or more transistor based volatile memory elements, or any other type of memory element).

Each segment page buffer circuit 418, 420, 422, 424, may be coupled with one or more column control lines 210 (e.g., one or more local bit lines 210) of the memory cell field 202.

Further, each memory cell segment 402, 404, 406, 408, 410, 412, 414, 416, may include a selection circuit (e.g. implemented as a multiplexer) 426, wherein the selection circuit 426 is coupled with the segment page buffer circuits 418, 420, 422, 424, of the respective memory cell segment 402, 404, 406, 408, 410, 412, 414, 416, and thus, when a specific column control line 210 is selected, with the selected column control line 210.

As shown in FIG. 4, global column control lines 428, 430, 432, 434 (e.g. global bit lines 428, 430, 432, 434) are provided. In an example, a plurality of selection circuits 426 of different memory cell segments 402, 404, 406, 408, 410, 412, 414, 416, may be coupled with one respectively assigned global column control line 428, 430, 432, 434. In an example, the global column control lines 428, 430, 432, 434, may be coupled with a respective master page buffer circuit (one master page buffer circuit may be provided for each global column control line 428, 430, 432, 434) 436, 438, 440, 442. Illustratively, the respective master page buffer circuit 436, 438, 440, 442 works as the at least one write buffer memory 212 and at least one read buffer memory 214, for example. Illustratively, the select circuit(s) may be connected between the segment page buffer circuits 418, 420, 422, 424, of the respective memory cell segment 402, 404, 406, 408, 410, 412, 414, 416, and the global column control lines 428, 430, 432, 434 (e.g. global bit lines 428, 430, 432, 434).

By providing a plurality of memory cell segments, e.g., in a NAND Flash memory cell arrangement, by way of example, in a single-level programming, very fast programming is achieved by using the reduced length of the column control lines (e.g., bit lines) and the associated reduction of the RC constant. Furthermore, as will be described in more detail below, the segmentation of the memory cell field 202 and the provision of a plurality of local page buffer circuits allows various efficient operation schemes in accessing the memory cells of the memory cell field 202 (e.g., in reading, programming or erasing).

Figure 5:
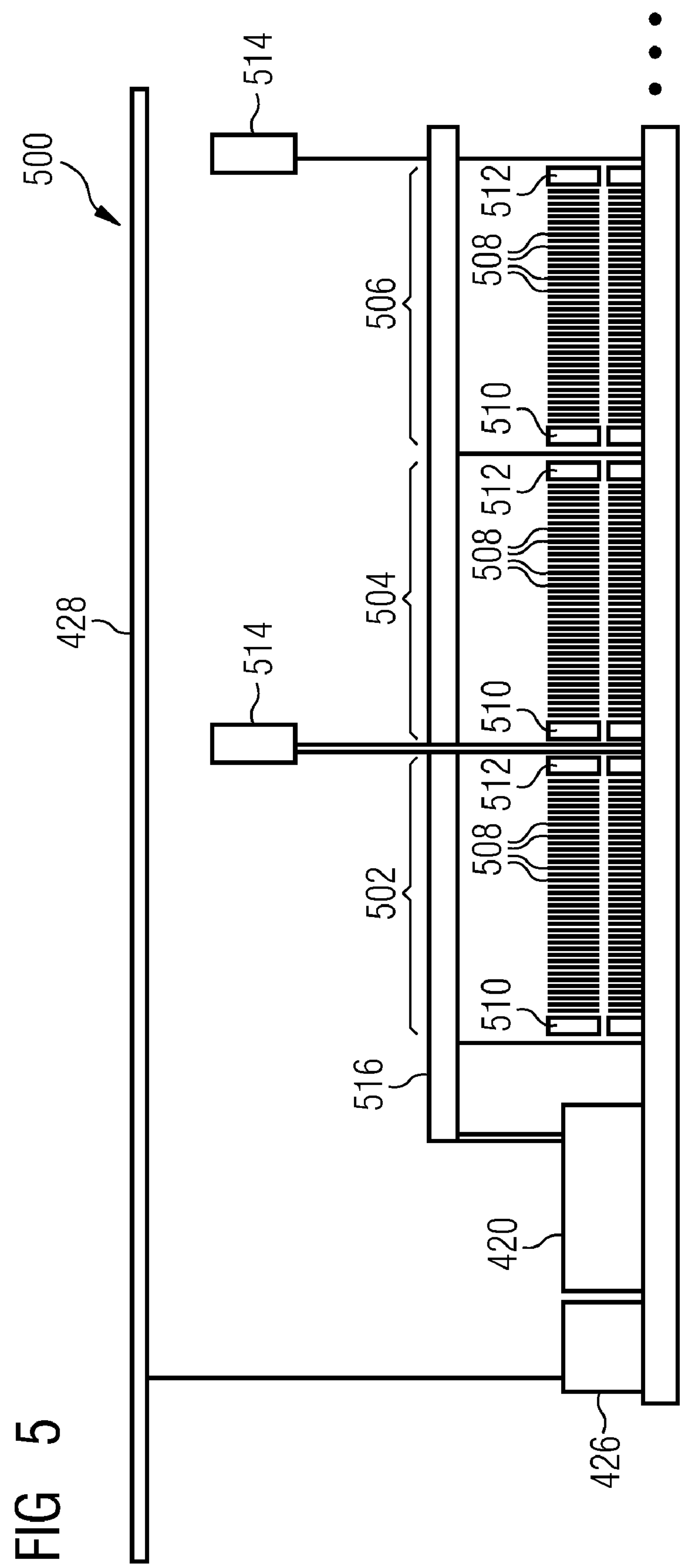
FIG. 5 shows a cross sectional view of a portion of a memory cell segment of the example portion of FIG. 4 in accordance with an embodiment along cross section A-A'.

FIG. 5 shows a cross sectional view 500 of a portion of a memory cell segment 402, 404, 406, 408, 410, 412, 414, 416, of the memory cell portion 400 of FIG. 4 along cross section A-A'.

In general, a large number (e.g., hundreds or thousands) memory cell strings may be connected to a respective global column control line 428, 430, 432, 434. In an example, as shown in FIG. 5, each memory cell string (e.g., each NAND memory cell string) (three of them are shown in FIG. 5 as an example) 502, 504, 506 may include a plurality of serially source-to-drain coupled memory cells 508 (in an example, each memory cell string 502, 504, 506, may include 16, 32, 64, 128, 256, 512, . . . , memory cells), e.g., a memory cell string select gate 510 (which may be coupled with a memory cell string select line) and, e.g., a ground select gate 512

(which may be coupled with a ground select line). The memory cells 508 may be configured as charge storing memory cells such as, e.g., as floating gate memory cells or as charge trapping memory cells. Furthermore, a source line 514 may be provided and may be coupled to one or more memory cell strings 502, 504, 506 (by way of example, as shown in FIG. 5, a source line 514 may be shared by two adjacent memory cell strings 502, 504) via the ground select gates 512. In an example, the source line 514 may be coupled with a ground potential, e.g., via a grounding structure. In order to electrically couple the one or more memory cell strings 502, 504, 506, with the local page buffer circuit 420 (and thus with, e.g., the latch and the data storing element of the local page buffer circuit 420), a local column control line 516 (e.g., a local bit line) may be provided, which may be coupled with the local page buffer circuit 420 and with the memory cell string select gate 510 of the coupled memory cell strings 502, 504, 506. In an example, the local column control line 516 may be considered as sub-global column control line.

Thus, in an example, the global column control lines 428, 430, 432, 434 (e.g. global bit lines 428, 430, 432, 434) may be segmented into respective pluralities of sub-global column control lines (e.g. sub-global bit lines), wherein each sub-global column control line may be related (in other words, assigned) to a number of memory cell strings 502, 504, 506. In an implementation, one (segment) analog-to-digital converter circuit (e.g., one (segment) latch) may be related (in other words, assigned) to each sub-global column control line. Each (segment) analog-to-digital converter circuit (e.g., each (segment) latch) may be connected (e.g., via an electrical connection such as, e.g., a bus) to the master page buffer circuit that may exist only once on the chip (system). It is to be noted that in an alternative embodiment, a plurality of hierarchy levels with respect to the segmentation of the memory cell field and thus with respect to the segmentation of the page buffer circuits, may be provided.

In an implementation, the select circuit(s) is/are optional. By way of example, the select circuit(s) may be configured as multiplexer(s) and may be related to (in other words, assigned to) the latches to reduce pitch in higher metallization levels.

In an implementation, the signal lines to the master page buffer circuits may be activated only once per access operation, e.g., in a read operation when the latch is switching, or after one program (PGM) pulse, if the memory cell was passing its target $V_t$ level (which illustratively means that the memory cell is sensed at the corresponding PV, program verify, as programmed) after this program pulse.

In various embodiments, a substantial reduction of the typical time constants (e.g., for charging and discharging) and the power consumption for verify/read operations may be achieved. Thus, in an embodiment, a higher performance on a given current limit for a chip (especially for multi-bit per memory cell applications) may be achieved. Furthermore, in various implementations, remarkable lower read currents may be applicable for read operations, which may have a positive impact on different operating margins (back pattern, impact of bit line capacitance variations on disturb window, read disturb, for example).

In an embodiment, a segmentation of the Global Bit Line(s) in NAND devices is provided to reduce the relevant resistances and capacitances to be charged and discharged during read and/or verify operations as well as in inhibit operations. Each memory cell segment may have its own charge circuit and discharge circuit as well as its own sensing circuit (such as, e.g., an analog-to-digital converter).

The whole (MLC) information about the data content of each cell read and programmed in parallel may be stored and recovered in the master page buffer circuits. The master page buffer circuits may exist only once in the system and may be connected, e.g., via (MUX) (signal) lines with the single latches.

Figure 6:
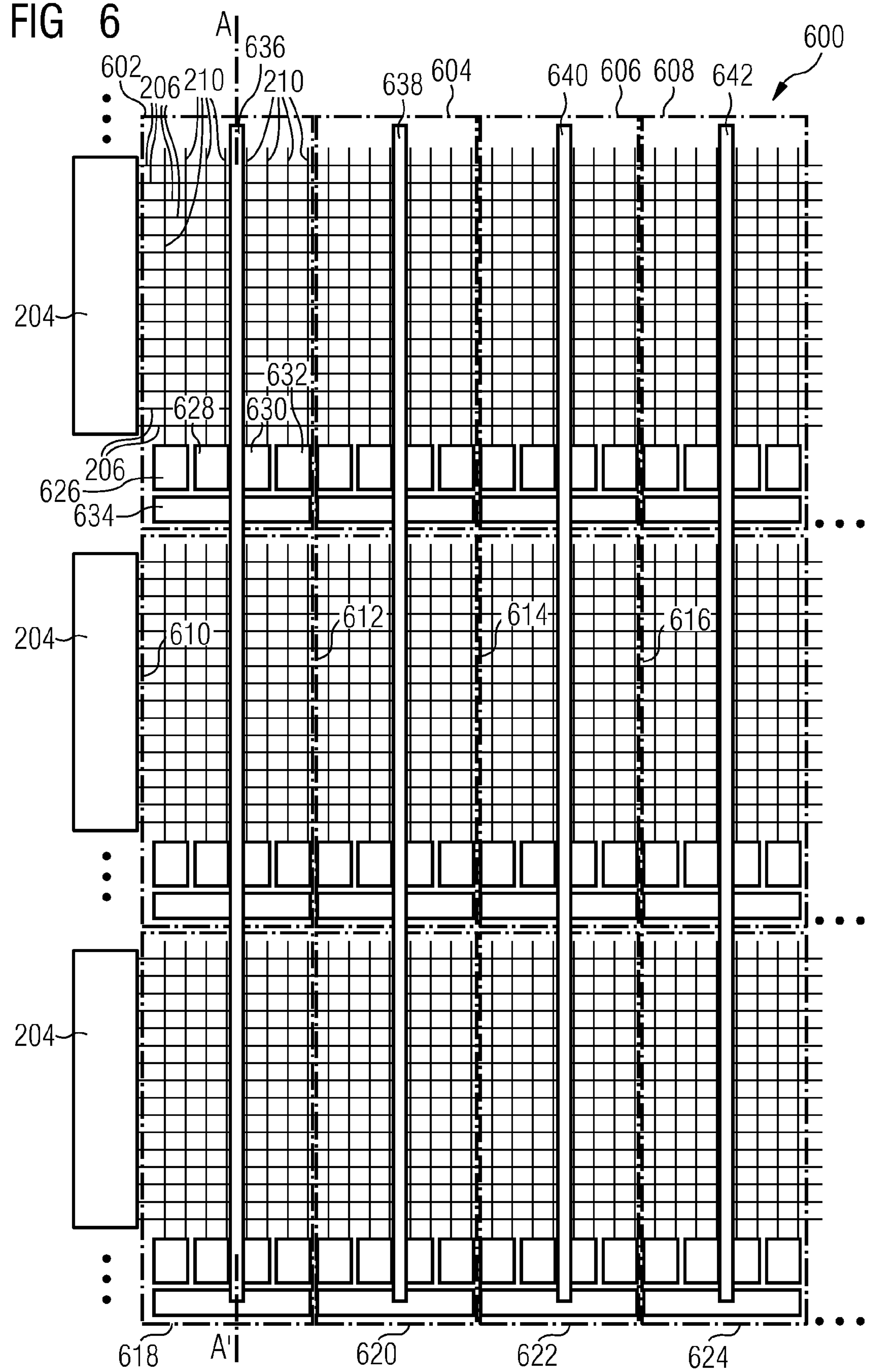
FIG. 6 shows a top view of an example portion of the memory of FIG. 2 in accordance with another embodiment.

FIG. 6 shows a top view of a memory cell portion 600 of the memory 124 in accordance with another embodiment including the row decoder circuit 204.

As shown in FIG. 6, in an embodiment, the memory cell field (e.g. the NAND memory cell field) 202 includes a plurality of memory cell segments 602, 604, 606, 608, 610, 612, 614, 616, 618, 620, 622, 624, twelve of which are shown in FIG. 6 (in general, an arbitrary number of memory cell segments may be provided in the memory cell field (e.g. the NAND memory cell field) 202). In an implementation, all memory cell segments 602, 604, 606, 608, 610, 612, 614, 616, 618, 620, 622, 624, may have the identical structure.

By way of example, each memory cell segment 602, 604, 606, 608, 610, 612, 614, 616, 618, 620, 622, 624, may include a plurality of memory cells, which may be grouped and coupled in a plurality of NAND memory cell strings (e.g., as described above with reference to FIG. 3).

Furthermore, each memory cell segment 602, 604, 606, 608, 610, 612, 614, 616, 618, 620, 622, 624, may include a plurality of local page buffer circuits 626, 628, 630, 632 (in the following also referred to as segment page buffer circuits 626, 628, 630, 632), wherein each segment page buffer circuit 626, 628, 630, 632, may be assigned to one or more (e.g., two, three, four or even more) memory cell pages of the (each memory cell page may include a plurality of memory cell strings) memory cell segment 602, 604, 606, 608, 610, 612, 614, 616, 618, 620, 622, 624. In an embodiment, a memory cell page may be understood as a group of memory cells, which are coupled with the same row control line (e.g., with the same word line) 206 (it is to be noted that in an example, a memory cell page may include only a portion of those memory cells which are coupled with the same row control line (e.g., with the same word line) 206). As will be described in more detail below, each segment page buffer circuit 626, 628, 630, 632, may include an analog-to-digital converter (e.g., a sense amplifier or a latch) and at least one data storing element (e.g., one or more capacitor based volatile memory elements (e.g. dynamic random access memory (DRAM) elements) or one or more transistor based volatile memory elements.

Each segment page buffer circuit 626, 628, 630, 632, may be coupled with one or more column control lines 210 (e.g., one or more local bit lines 210) of the memory cell field 202.

Further, each memory cell segment 602, 604, 606, 608, 610, 612, 614, 616, 618, 620, 622, 624, may include a selection circuit (e.g., implemented as a multiplexer) 634, wherein the selection circuit 634 is coupled with the segment page buffer circuits 626, 628, 630, 632, of the respective memory cell segment 602, 604, 606, 608, 610, 612, 614, 616, 618, 620, 622, 624, and thus, when a specific column control line 210 is selected, with the selected column control line 210.

As shown in FIG. 6, global column control lines 636, 638, 640, 642 (e.g. global bit lines 636, 638, 640, 642) are provided. In an example, a plurality of selection circuits 634 of different memory cell segments 602, 604, 606, 608, 610, 612, 614, 616, 618, 620, 622, 624, may be coupled with one respectively assigned global column control line 636, 638, 640, 642. In difference to the embodiment shown in FIG. 4, in accordance with this embodiment, no master page buffer circuit is provided. Illustratively, in this embodiment, e.g., a plurality of latches of different segment page buffer circuits 626, 628, 630, 632 (e.g., from the same or from different memory cell segments 602, 604, 606, 608, 610, 612, 614, 616,

618, 620, 622, 624) are controlled as a "logic" multi-level cell (or multi-bit cell) page buffer circuit. Illustratively, the latches of different segment page buffer circuits 626, 628, 630, 632, may buffer data temporarily used in an access operation with respect to another memory cell string, the "outsourced" page buffer elements are not assigned to. In other words, in an example, when an access operation is carried out on a memory cell to which one segment page buffer circuit 626, 628, 630, 632, is assigned to, data which, e.g., should be temporarily stored during the access operation, may be transferred to one or more latches of another segment page buffer circuit 626, 628, 630, 632, and may be buffered there. In an example, when an access operation is carried out on one memory cell segment that is coupled with a global column control line 636, 638, 640, 642, the buffered data during the access operation may be transferred to and stored in the one or more latches of those segment page buffer circuits 626, 628, 630, 632, which are coupled to the same global column control line 636, 638, 640, 642. In other words, in one example, illustratively, the latches of the segment page buffer circuits 626, 628, 630, 632, which are coupled to the same global column control line 636, 638, 640, 642, together form a common "logic" page buffer circuit latch, thereby temporarily increasing the number of latches for the page buffer circuit of the memory cell segment to be accessed.

The respective control logic for the data transfer may be implemented, e.g., by the memory cell arrangement controller 122 or the memory-internal controller 220 or by any other control logic. Thus, in this implementation, the master page buffer circuit may be omitted. In an example, all the data storing elements (e.g., latches) related to the different sub arrays (in other words, segments) can be switched by a sensing action or by an external signal (e.g., by a controller such as one as described above).

However, also in this example, illustratively, the select circuit(s) may be connected between the segment page buffer circuits 418, 420, 422, 424, of the respective memory cell segment 402, 404, 406, 408, 410, 412, 414, 416, and the global column control lines 428, 430, 432, 434 (e.g., global bit lines 428, 430, 432, 434).

By providing a plurality of memory cell segments, e.g., in a NAND Flash memory cell arrangement, by way of example, in a single-level programming, a very fast programming is achieved by using the reduced length of the column control lines (e.g., bit lines) and the associated reduction of the RC constant. Furthermore, in a single level programming, the single segments may be working independently from each other and in a high parallel mode, e.g., in a data burst in mode (e.g., by using the global bit lines "GBL's" in a certain number of single local page buffers, associated with an array segment, sequentially a page of data may be loaded in each local page buffer circuit, after filling a number of local page buffer circuit, in each array segment and the associated "data pages" may be programmed in parallel in a single level cell (SLC) mode. The similar argumentation (reverse) holds true for a burst (speculative) read mode.

Furthermore, as will be described in more detail below, the segmentation of the memory cell field 202 and the provision of a plurality of local page buffer circuits allows various efficient operation schemes in accessing the memory cells of the memory cell field 202 (e.g., in reading, programming, inhibiting, or erasing).

In this embodiment shown in FIG. 6, an approach may be seen in segmenting the array (e.g., memory cell field 202) into the number of levels to be programmed in the (MLC) device. Thus, the page buffer circuit can illustratively be distributed across the whole chip. The sub bit lines may be short for sensing and inhibit reasons. In an embodiment, the information about the memory cell's data (to be read or programmed, for example) is distributed over a plurality of latches (e.g., all latches) of the page buffer circuits coupled to the same global column control line. The latches may be connected via the repective selection circuits (e.g., multiplexers) and the connected global column control lines (e.g., global bit lines).

The role of each latch may be dynamical depending on which is the active (to be read or programmed) WL (page).

Thus, in various embodiments, (very) short bit lines may be combined with no huge array overhead for MLC devices.

Illustratively, in an embodiment, the MLC page buffer structure may be distributed over the whole chip. The different parts of the page buffer circuits may be connected via a (MUX) signal line system (including, e.g., the global bit lines) (which may be of very high parallelism). In an implementation, the role of each latch may be dynamical, depending on the active page address. Each latch may be used as a sensing circuit as well as to store information about the sensing results of other latches that is needed for MLC access operations (e.g., programming operations or read operations or erase operations).

The structure of the memory cell strings in the embodiment of FIG. 6 is similar to the structure as described with reference to FIG. 5. Therefore, reference is made to the description of FIG. 5 with respect to the cross sectional view 500 of a portion of a memory cell segment of the memory cell portion 600 of FIG. 6 along cross section A-A'.

An MLC page buffer circuit may include a certain number of latches (therefore transistors) that is proportional to the number of levels that have to be programmed into the device, in other words, into a respective memory cell. The latches should be connected by wiring (that may be shielded). The width of each page buffer circuit may be limited to a certain number of bit lines (pitches) related to the memory cell array organization. Large (due to limited width) page buffer circuits may be difficult to design objects.

In an embodiment, in a segmented memory cell field, a single latch circuit may be assigned to each memory cell segment. Furthermore, all latch circuits (alternatively, e.g., some of the single latch circuits, e.g., all those single latch circuits which are coupled with the same global column control line) together may act as an MLC page buffer circuit (e.g., together with a corresponding control software or firmware controlling the respective single latch circuits). Furthermore, in an implementation, all latching circuits combined to a page buffer circuit may be connected by global lines, e.g., by global column control lines such as global bit lines.

In an embodiment, the number of latch circuits provided in a page buffer circuit may be equivalent to the number of levels to be programmed in a respective memory cell.

Moreover, in an example, there may be provided some additional segmentation for extra latches used for special features such as, e.g., for soft decoding of the content of a memory cell (e.g., using a kind of oversampling of the memory cell levels). The function of the latch circuits may be controlled by an autonomous decoder system. Further, the number of global lines and page buffer circuits may be (at least) that of the number of memory cells programmed in parallel. The data input and data output may be done via the global lines.

As an option, the global lines may be connected to an (e.g., differential) detection and amplifying circuit. As a further option, the latch circuits may be connected via a local line system (e.g., via a local bitline system) and may act as a shift register, e.g., for a soft decoding of the content of a memory cell during a read operation or for other purposes, as desired.

Figure 7:
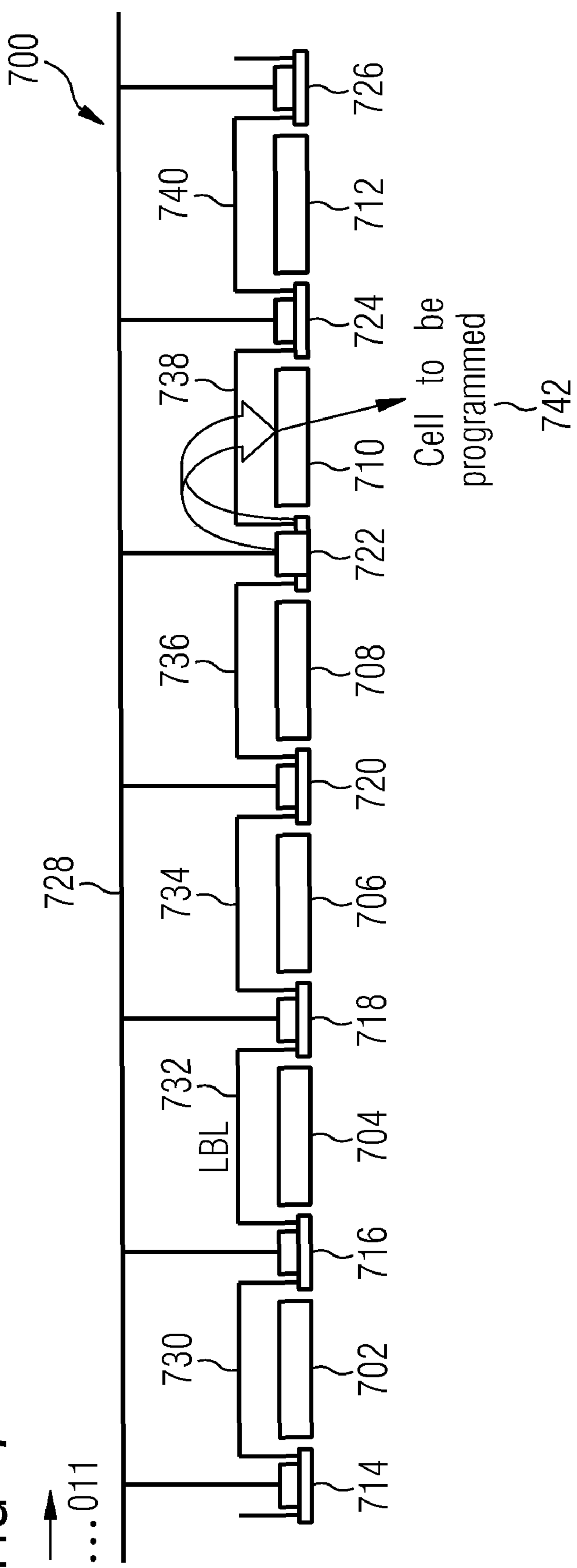
FIG. 7 shows a schematic view of a plurality of memory cell segments in accordance with an embodiment.

FIG. 7 shows a schematic view 700 of a plurality of memory cell segments 702, 704, 706, 708, 710, 712, in accordance with an embodiment, which may have the identical structure as described above. FIG. 7 shows six memory cell segments, namely a first memory cell segment 702, a second memory cell segment 704, a third memory cell segment 706, a fourth memory cell segment 708, a fifth memory cell segment 710, and a sixth memory cell segment 712. Only for clarity reasons, in FIG. 7, although they may be part of the memory cell segments 702, 704, 706, 708, 710, 712, as described above, the assigned single latch circuits 714, 716, 718, 720, 722, 724, 726, are also shown in FIG. 7. FIG. 7 shows seven single latch circuits, namely a first single latch circuit 714, a second single latch circuit 716, a third single latch circuit 718, a fourth single latch circuit 720, a fifth single latch circuit 722, a sixth single latch circuit 724, and a seventh single latch circuit 726. The single latch circuits 714, 716, 718, 720, 722, 724, 726, and thus the memory cell segments 702, 704, 706, 708, 710, 712, may be connected with each other and with corresponding data input and data output interfaces and/or to a controller via one or more global lines 728 such as, e.g., one or more global column control lines 728 such as, e.g., one or more global bit lines 728. Furthermore, in this example, the respective adjacent memory cell segments 702, 704, 706, 708, 710, 712, may be connected with each other via optionally additionally provided local lines 730, 732, 734, 736, 738, 740, such as, e.g., local bit lines. In this example, it is assumed that the fifth memory cell segment 710 includes a memory cell 742 to be programmed. Therefore, the assigned fifth single latch circuit 722 will also be referred to as the dynamic single latch circuit 722.

In the following, an example of a program operation using the structure as shown in FIG. 7 will be described in more detail with reference to a program flow diagram 800 of FIGS. 8A and 8B.

This coding sheme used as an example here implies a minimum number of loads and unloads on the global bit line (GBL) during a programming operation. This means a minimum of power consumption and a maximum of performance. Of course, in another coding scheme for the MLC information in the single latch unit less latches may be used than shown here, and this may be implemeted, but this would imply the demand on more load and unload operations on the global bit lines (GBLs).

In this example, memory cells capable of storing three bits per memory cell are assumed, which corresponds to possible eight distinguishable memory cell levels, for example. It is to be noted that the coding and the content of the single latch circuits are depending on the respective target level. One single latch circuit may be used as the dynamic single latch circuit (in this example, the single latch circuit 722), that is used for verify and inhibit operations. There may be a mapping between the physical single latch circuits and its logical number controlled by a controller, e.g., using the selection circuits such as e.g. the multiplexers, as described above. Table 1 shows a program coding table which may be provided in an example:

TABLE 1

| Program coding table<br>Logical single latch circuit # (LSLC#) | | | | | | | |
|---|---|---|---|---|---|---|---|
| Level | d | 1 | 2 | 3 | 4 | 5 | 6 |
| 0 | 0 | 0 | 0 | 0 | 0 | 0 | 0 |
| 1 | 1 | 0 | 0 | 0 | 0 | 0 | 0 |
| 2 | 1 | 1 | 0 | 0 | 0 | 0 | 0 |
| 3 | 1 | 1 | 1 | 0 | 0 | 0 | 0 |
| 4 | 1 | 1 | 1 | 1 | 0 | 0 | 0 |
| 5 | 1 | 1 | 1 | 1 | 1 | 0 | 0 |
| 6 | 1 | 1 | 1 | 1 | 1 | 1 | 0 |
| 7 | 1 | 1 | 1 | 1 | 1 | 1 | 1 |

After having started the program operation in 802, at the beginning, all global lines are raised up to a certain electrical voltage corresponding to a certain level (which may correspond to a logical value "0"). It is assumed that a value will be programmed into the memory cell 742 corresponding to a 3-bit value.

In 804, the global line (e.g., the global bit line) to which the memory cell 742 to be programmed is connected will be driven to an electrical potential corresponding to the value of the first bit of the 3-bit value to be programmed into the memory cell 742 to be programmed. In this example, the nomenclature is used such that a logical value "1" means a "discharged" global line. The driving of the global line to the electrical potential corresponding to the value of the first bit of the 3-bit value will lead to a latching of this value into the third logical single latch circuit LSLC#3 (see Table 1 above).

Then, in 806, the global line (e.g., the global bit line) to which the memory cell 742 to be programmed is connected will be driven (e.g., recharged) to an electrical potential corresponding to the value of the second bit of the 3-bit value to be programmed into the memory cell 742 to be programmed. The driving of the global line to the electrical potential corresponding to the value of the second bit of the 3-bit value will lead to a latching of this value into the first logical single latch circuit LSLC#1 and the fifth logical single latch circuit LSLC#5 (see Table 1 above).

Next, in 808, the global line (e.g., the global bit line) to which the memory cell 742 to be programmed is connected will be driven (e.g., recharged) to an electrical potential corresponding to the value of the third bit of the 3-bit value to be programmed into the memory cell 742 to be programmed. The driving of the global line to the electrical potential corresponding to the value of the third bit of the 3-bit value will lead to a latching of this value into the dynamical logical single latch circuit LSLC#d, the second logical single latch circuit LSLC#2, the fourth logical single latch circuit LSLC#4, and the sixth logical single latch circuit LSLC#6 (see Table 1 above).

Subsequently, in 810, the global line (e.g., the global bit line) to which the memory cell 742 to be programmed is connected will be driven (e.g., recharged) to an electrical potential corresponding to the logical value stored in the third logical single latch circuit LSLC#3 and the corresponding electrical potential will be latched into the fourth logical single latch circuit LSLC#4, the fifth logical single latch circuit LSLC#5, and the sixth logical single latch circuit LSLC#6. It is to be noted that in an example, only a transistion from a logical value "1" to a logical value "0" may be allowed.

Subsequently, in 812, the global line (e.g., the global bit line) to which the memory cell 742 to be programmed is connected will be driven (e.g., recharged) to an electrical potential corresponding to the logical value stored in the first logical single latch circuit LSLC#1 and the fifth logical single latch circuit LSLC#5. In case one of the values stored in the first logical single latch circuit LSLC#1 or the fifth logical single latch circuit LSLC#5 is a logical value "1", the global line is discharged. Furthermore, the corresponding electrical potential of the global line will be latched into the second logical single latch circuit LSLC#4 and the sixth logical single latch circuit LSLC#6.

Then, in 814, the global line (e.g., the global bit line) to which the memory cell 742 to be programmed is connected will be driven (e.g., recharged) to an electrical potential corresponding to the logical value stored in the sixth logical single latch circuit LSLC#6. The corresponding electrical potential of the global line will be latched into the logical single latch circuits of a number smaller than the sixth logical single latch circuit LSLC#6. In other words, the corresponding electrical potential of the global line will be latched into the first logical single latch circuit LSLC#1, the second logical single latch circuit LSLC#2, the third logical single latch circuit LSLC#3, the fourth logical single latch circuit LSLC#4, and the fifth logical single latch circuit LSLC#5.

Then, in 816, the global line (e.g., the global bit line) to which the memory cell 742 to be programmed is connected will be driven (e.g., recharged) to an electrical potential corresponding to the logical value stored in the fifth logical single latch circuit LSLC#5. The corresponding electrical potential of the global line will be latched into the logical single latch circuits of a number smaller than the fifth logical single latch circuit LSLC#5. In other words, the corresponding electrical potential of the global line will be latched into the first logical single latch circuit LSLC#1, the second logical single latch circuit LSLC#2, the third logical single latch circuit LSLC#3, and the fourth logical single latch circuit LSLC#4.

Then, in 818, the global line (e.g., the global bit line) to which the memory cell 742 to be programmed is connected will be driven (e.g., recharged) to an electrical potential corresponding to the logical value stored in the fourth logical single latch circuit LSLC#4. The corresponding electrical potential of the global line will be latched into the logical single latch circuits of a number smaller than the fourth logical single latch circuit LSLC#4. In other words, the corresponding electrical potential of the global line will be latched into the first logical single latch circuit LSLC#1, the second logical single latch circuit LSLC#2, and the third logical single latch circuit LSLC#3.

Then, in 820, the global line (e.g., the global bit line) to which the memory cell 742 to be programmed is connected will be driven (e.g., recharged) to an electrical potential corresponding to the logical value stored in the third logical single latch circuit LSLC#3. The corresponding electrical potential of the global line will be latched into the logical single latch circuits of a number smaller than the third logical single latch circuit LSLC#3. In other words, the corresponding electrical potential of the global line will be latched into the first logical single latch circuit LSLC#1, and the second logical single latch circuit LSLC#2.

Then, in 822, the global line (e.g., the global bit line) to which the memory cell 742 to be programmed is connected will be driven (e.g., recharged) to an electrical potential corresponding to the logical value stored in the second logical single latch circuit LSLC#2. The corresponding electrical potential of the global line will be latched into the logical single latch circuits of a number smaller than the second logical single latch circuit LSLC#2. In other words, the corresponding electrical potential of the global line will be latched into the first logical single latch circuit LSLC#1.

Finally, in 824, the global line (e.g., the global bit line) to which the memory cell 742 to be programmed is connected will be driven (e.g., recharged) to an electrical potential corresponding to the logical value stored in the first logical single latch circuit LSLC#1. The corresponding electrical potential of the global line will be latched into the dynamical logical single latch circuit which is assigned to the memory cell segment of the memory cell 742 to be programmed. In other words, the corresponding electrical potential of the global line will be latched into the dynamical logical single latch circuit LSLC#d.

Then, the program operation is completed and ends in 826.

In the following, an example of a program and verify operation using the structure as shown in FIG. 7 will be described in more detail with reference to a program and verify flow diagram 900 of FIG. 9.

After having started the program and verify operation in 902, in 904, depending on the content of the dynamical logical single latch circuit LSLC#d, the local bit line may be inhibited (in case of a logical value "0" stored in the dynamical logical single latch circuit LSLC#d) or not inhibited (in case of a logical value "1" stored in the dynamical logical single latch circuit LSLC#d)

Then, optionally, in 906, all global lines (e.g., all global bit lines) may be initialized at a voltage level corresponding to a logical "0" level.

Next, in 908, a programming pulse may be applied to the memory cell 742 to be programmed, followed by a start of the verification process from the lowest level in 910.

It is to be noted, that in an example, the local single latch circuit assigned to the memory cell segment that includes the memory cell 742 to be programmed is only allowed to flip if the corresponding global line (e.g., corresponding global bit line) has an electrical potential that corresponds to the logical value "0". Then, in 912, the logical single latch circuit related to the current verify level may be connected to the respective global line.

Then, in 914, for each level the related logical single latch circuits are connected to the respective global lines and respectively drives it to an electrical potential corresponding to a logical value "1" or not, depending on data content (if a logical value "0" is latched in the corresponding single latch circuit, an electrical potential corresponding to a logical value "1" is driven on the global line).

Processes 912 and 914 are successively repeated for each respective next level to verify (from the lower level to the respective higher level). After the verification of the highest level, in 916, all global lines are driven to an electrical potential corresponding to the logical value "1".

Then, in 918, all dynamical single latch circuits involved in the program operation are connected to the respective global line. In case the logical value stored in the corresponding dynamical single latch circuit is "1", the global line is driven to an electrical potential corresponding to the logical value "0", else, the global line is kept at the electrical potential corresponding to the logical value "1".

Next, in 920, it is determined as to whether all global lines are driven to an electrical potential corresponding to the logical value "1". If it is determined that all global lines are driven to an electrical potential corresponding to the logical value "1" ("Yes" in 920), the program and verify operation end in 922). If it is determined that not all global lines are yet driven to an electrical potential corresponding to the logical value "1" ("No" in 920), a further program pulse is applied, in other words, the process continues in 908. In an example, the process may also be stopped when a predefined number of programming pulses have already been applied to the memory cell(s) to be programmed (in this case, an error message may be output).

In the following, an example of a read operation using the structure as shown in FIG. 7 will be described in more detail with reference to a read flow diagram 1000 of FIGS. 10A and 10B.

In this example, it is to be noted that it is assumed that the inverted data are output by the resective controller.

After having started the read operation in 1002, in 1004, all global lines (e.g., all global bit lines) are initialized to an electrical potential corresponding to the logical value "0".

In this example, it is assumed that the verification is starting from the lowest level result in the dynamical logical single latch circuit LSLC#d. In 1006, the connected global line may be driven to the current level (e.g., the lowest level as the first level) of the dynamical logical single latch circuit LSLC#d (e.g., the global line may be discharged in case the dynamical logical single latch circuit LSLC#d has stored a logical value "1"). Furthermore, the electrical potential the global line is driven to may be latched into the first logical single latch circuit LSLC#1.

Then, the next level (e.g., the next higher level, e.g., the second lowest level as the second level) may be verified as the current level. This may be carried out such that the connected global line may be driven to the current level (e.g., the second lowest level as the second level) of the dynamical logical single latch circuit LSLC#d (e.g., the global line may be discharged in case the dynamical logical single latch circuit LSLC#d has stored a logical value "1"). Furthermore, the electrical potential the global line is driven to may be latched into the second logical single latch circuit LSLC#2.

This process is repeated for each level to be verified (e.g., for each level in increasing order). In other words, process 1006 is repeated for each level to be verified.

Thus, in an example, in 1010, the next level may be verified as the current level by driving the connected global line to the current level (e.g., the third lowest level as the third level) of the dynamical logical single latch circuit LSLC#d (e.g., the global line may be discharged in case the dynamical logical single latch circuit LSLC#d has stored a logical value "1"). Furthermore, the electrical potential the global line is driven to may be latched into the third logical single latch circuit LSLC#3.

Furthermore, in an example, in 1012, the next level may be verified as the current level by driving the connected global line to the current level (e.g., the fourth lowest level as the fourth level) of the dynamical logical single latch circuit LSLC#d (e.g., the global line may be discharged in case the dynamical logical single latch circuit LSLC#d has stored a logical value "1"). Furthermore, the electrical potential the global line is driven to may be latched into the fourth logical single latch circuit LSLC#4.

Next, in an example, in 1014, the next level may be verified as the current level by driving the connected global line to the current level (e.g., the fifth lowest level as the fifth level) of the dynamical logical single latch circuit LSLC#d (e.g., the global line may be discharged in case the dynamical logical single latch circuit LSLC#d has stored a logical value "1"). Furthermore, the electrical potential the global line is driven to may be latched into the fifth logical single latch circuit LSLC#5.

Then, in an example, in 1016, the next level may be verified as the current level by driving the connected global line to the current level (e.g., the sixth lowest level as the sixth level) of the dynamical logical single latch circuit LSLC#d (e.g., the global line may be discharged in case the dynamical logical single latch circuit LSLC#d has stored a logical value "1"). Furthermore, the electrical potential the global line is driven to may be latched into the sixth logical single latch circuit LSLC#6.

Then, in an example, in 1018, the next level may be verified as the current level by driving the connected global line to the current level (e.g., the highest level as the seventh level) of the dynamical logical single latch circuit LSLC#d (e.g., the global line may be discharged in case the dynamical logical single latch circuit LSLC#d has stored a logical value "1"). Furthermore, the electrical potential the global line is driven to may be latched into the dynamical logical single latch circuit LSLC#d.

In 1020, in a following process after all levels have been verified, the global line may be driven (e.g., recharged) to an electrical potential corresponding to the logical value stored in the fourth logical single latch circuit LSLC#4. The corresponding electrical potential of the global line may be output as the first bit stored in the memory cell to be read.

Next, in 1022, the global line may be driven (e.g., recharged) to an electrical potential corresponding to the inverse logical value stored in the fourth logical single latch circuit LSLC#4. The corresponding electrical potential of the global line may be latched into the second logical single latch circuit LSLC#2 and the sixth logical single latch circuit LSLC#6. In this example, it is assumed that only a transistion from the logical value "1" to the logical value "0" is allowed in the respective single latch circuit.

Then, in 1024, the global line may be driven (e.g., recharged) to an electrical potential corresponding to the logical value stored in the second logical single latch circuit LSLC#2 and the sixth logical single latch circuit LSLC#6. The corresponding electrical potential of the global line may be output as the second bit stored in the memory cell to be read.

After having output the second bit, in 1026, the global line may be driven (e.g., recharged) to an electrical potential corresponding to the logical value stored in the second logical single latch circuit LSLC#2 and inverse logical value stored the sixth logical single latch circuit LSLC#6. The corresponding electrical potential of the global line may be latched into the first logical single latch circuit LSLC#1, the third logical single latch circuit LSLC#3, the fifth logical single latch circuit LSLC#5, and the dynamical logical single latch circuit LSLC#d. In this example, it is again assumed that only a transistion from the logical value "1" to the logical value "0" is allowed in the respective single latch circuit.

Next, in 1028, the global line may be driven (e.g., recharged) to an electrical potential corresponding to the logical value stored in the first logical single latch circuit LSLC#1, the third logical single latch circuit LSLC#3, the fifth logical single latch circuit LSLC#5, and the dynamical logical single latch circuit LSLC#d. The corresponding electrical potential of the global line may be output as the third bit stored in the memory cell to be read.

Then, the read operation is completed and ends in 1030.

The following table 2 illustrates the content of the logical single latch circuits after having read all levels of the memory cell to be read.

TABLE 2

Content of logical single latch circuits after having read all levels

| Level | Logical single latch circuit # (LSLC#) 1 | 2 | 3 | 4 | 5 | 6 | D |
|---|---|---|---|---|---|---|---|
| 0 | 1 | 1 | 1 | 1 | 1 | 1 | 1 |
| 1 | 0 | 1 | 1 | 1 | 1 | 1 | 1 |

TABLE 2-continued

| Content of logical single latch circuits after having read all levels Logical single latch circuit # (LSLC#) | | | | | | | |
|---|---|---|---|---|---|---|---|
| Level | 1 | 2 | 3 | 4 | 5 | 6 | D |
| 2 | 0 | 0 | 1 | 1 | 1 | 1 | 1 |
| 3 | 0 | 0 | 0 | 1 | 1 | 1 | 1 |
| 4 | 0 | 0 | 0 | 0 | 1 | 1 | 1 |
| 5 | 0 | 0 | 0 | 0 | 0 | 1 | 1 |
| 6 | 0 | 0 | 0 | 0 | 0 | 0 | 1 |
| 7 | 0 | 0 | 0 | 0 | 0 | 0 | 0 |

Figure 11:
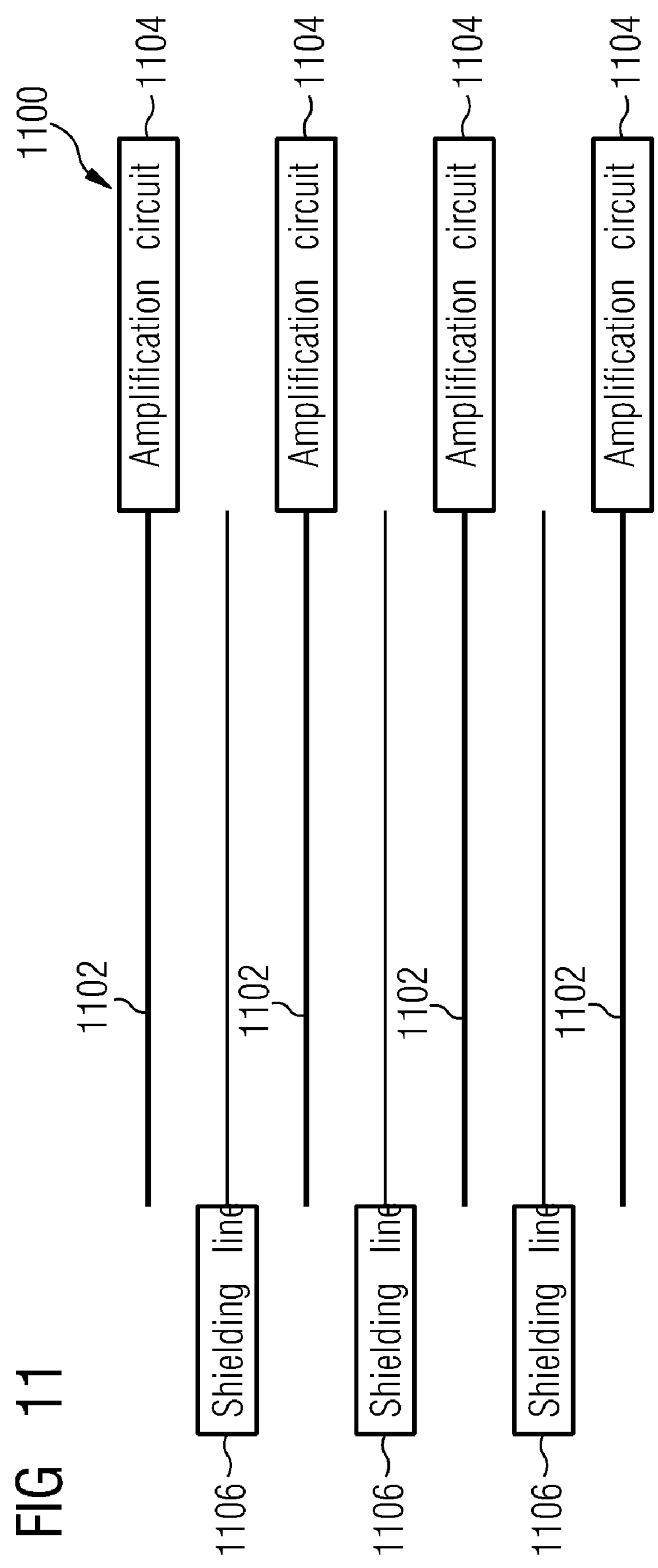
FIG. 11 shows a top view of a portion of a memory cell field in accordance with an embodiment.

Global page buffer lines 1102 (FIG. 11) connecting one or more of the page buffer circuits may have a huge capacitance and "tau (R*C)" compared to any local structures. Therefore, in an example, it may be provided to induce by local structures (data in cycle, single latch circuits, etc.) only a (weak) voltage drop. This voltage drop may be detected on an (differential) sensing circuit (e.g., a sense amplifier) and then the global page buffer line may be actively driven to its "0" level or ground potential. In an example, as shown in the top view 1100 in FIG. 11 of a portion of a memory cell field in accordance with an embodiment, there may be provided a plurality of global page buffer lines 1102, each of which may be coupled with one or more global page buffer line amplification circuits 1104. Furthermore, electrical shielded structures 1106 or lines 1106 (e.g., grounded electrical conductive lines) may be provided between each one of the global page buffer lines 1102.

Figure 12:
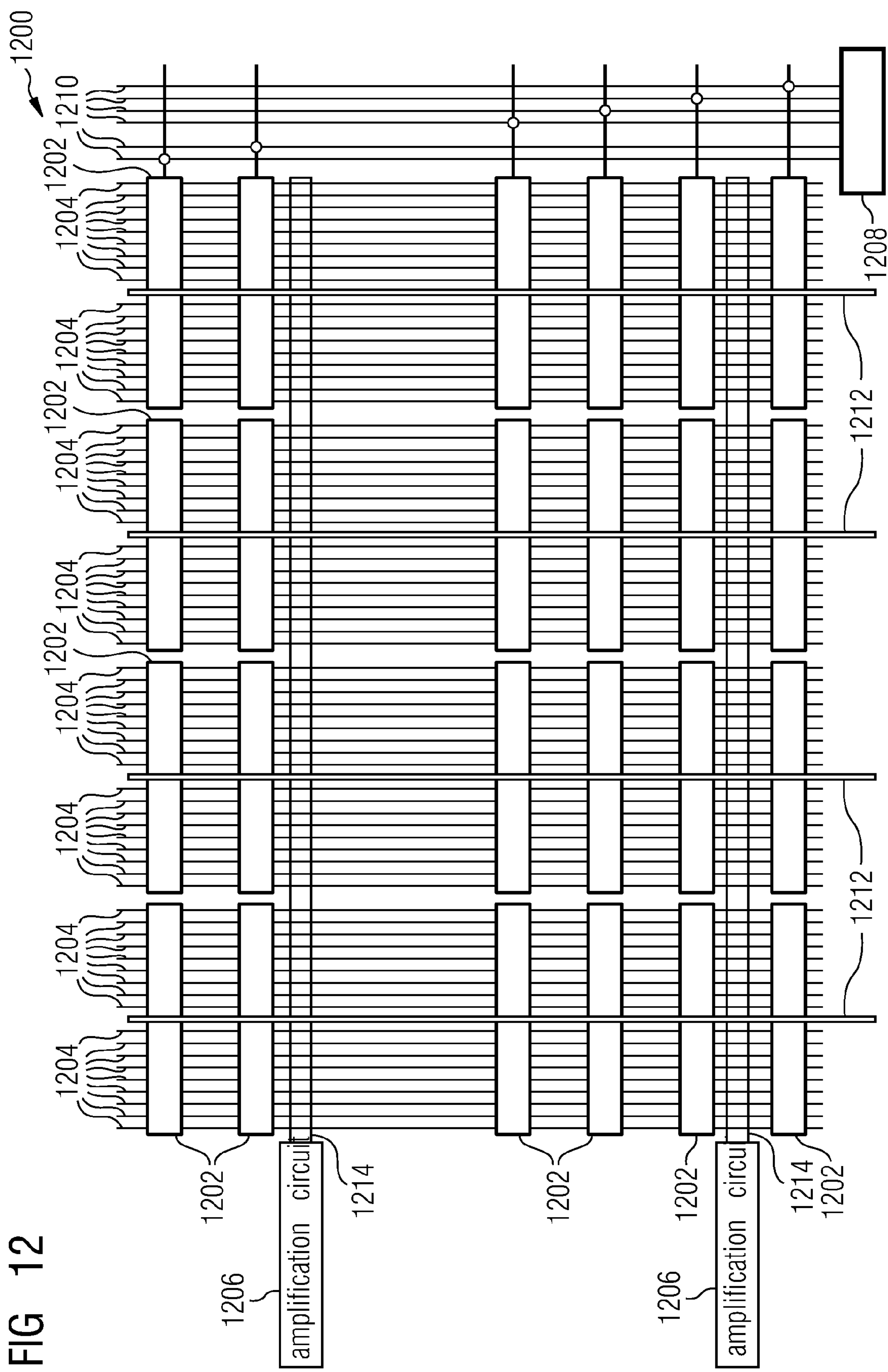
FIG. 12 shows a top view of a portion of a memory cell field with global page buffer line amplification circuits in accordance with an embodiment.

FIG. 12 shows a top view 1200 of a portion of a memory cell field with global page buffer line amplification circuits 1206 in accordance with an embodiment.

In this example, the memory cell field may include a plurality of memory cell segments (each having a plurality of memory cells, e.g., arranged in a plurality of NAND memory cell strings) and a plurality of respectively assigned segment page buffer circuits, each including a single latch circuit 1202, as, e.g., described with reference to FIGS. 4 and 6. Furthermore, FIG. 12 shows a plurality of global bit lines 1204, and crossing the plurality of global bit lines 1204, a plurality of global page buffer lines 1214 connecting one or more page buffer circuits and, therein, e.g., one or more single latch circuits 1202. For each global page buffer line 1214, there may be provided a global page buffer line amplification circuit 1206 configured to provide amplified signals to and from the connected page buffer circuits. Each one of the page buffer circuits and, therein, each single latch circuit 1202 may be coupled to a single latch circuit enabling multiplexer 1208 via a respective single latch circuit multiplexer enable line 1210. The function or operation of the single latch circuits 1202 or groups of single latch circuits 1202 may be controlled by the single latch circuit enabling multiplexer 1208, e.g., the activating or deactivating of the single latch circuits 1202 or groups of single latch circuits 1202 or operating them in different operating modes, e.g., the driving of data to the global page buffer lines 1214, the driving of inverted data to the global page buffer lines 1214, the latching of data from the global page buffer lines 1214, the latching of data from local bit lines, allowing only logical "1" to logical "0" transitions in latches, etc. Furthermore, in an example, four single latch circuit trigger lines 1212 may be provided running parallel with the global bit lines 1204 and being connected to single latch circuits 1202 of one or more memory cell segments. In this example, the single latch circuit multiplexer enable lines 1210 may be less time critical then the single latch circuit trigger lines 1212 because the enable signal is a preset signal and the single latch circuit action may be triggered by the respective single latch circuit trigger line 1212 on the single latch circuit group (if enabled). The triggering of the single latch circuit blocks in word line direction may be performed independently from each other (this may be provided, e.g., to adapt some sensing ore inhibit options to word line tau related delays).

In an embodiment, an integrated circuit having a memory cell arrangement is provided. The memory cell arrangement may include a plurality of multiple bit information storing memory cells, a plurality of buffer circuits, each buffer circuit being coupled to at least one multiple bit information storing memory cell of the plurality of multiple bit information storing memory cells, and a controller configured to control an access operation to access at least one multiple bit information storing memory cell using the buffer circuit coupled to the at least one multiple bit information storing memory cell to be accessed, and a buffer circuit of at least one other multiple bit information storing memory cell being coupled to at least one other multiple bit information storing memory cell.

In an example of this embodiment, the multiple bit information storing memory cells may be configured as multi-level memory cells. In another example of this embodiment, the multiple bit information storing memory cells may be configured as multi-bit memory cells. In yet another example of this embodiment, the buffer circuits may be configured as page buffer circuits. In yet another example of this embodiment, each buffer circuit of the plurality of buffer circuits may include an analog-to-digital converter and a data storing element. In yet another example of this embodiment, the controller may be configured to control the access operation to access at least one multiple bit information storing memory cell using the buffer circuit coupled to the at least one multiple bit information storing memory cell to be accessed, and the data storing element of at least one other multiple bit information storing memory cell being coupled to at least one other multiple bit information storing memory cell. In yet another example of this embodiment, the access operation is an access operation selected from a group of access operations consisting of: a read operation, a program operation, an inhibit operation, and an erase operation. In yet another example of this embodiment, the plurality of multiple bit information storing memory cells may be grouped in a plurality of memory cell strings of serially source-to-drain-coupled memory cells, and may be arranged in a plurality of memory cell segments on or in a substrate, wherein each memory cell segment of the plurality of memory cell segments may include a plurality of multiple bit information storing memory cells and a plurality of segment buffer circuits, wherein each segment buffer circuit may be assigned to at least one memory cell string of the memory cell segment, wherein the memory cell arrangement may further include at least one global control line, and wherein the at least one global control line may be connected to segment buffer circuits of different memory cell segments of the plurality of memory cell segments. In yet another example of this embodiment, the integrated circuit may further include at least one segment multiplexer coupled with a plurality of segment buffer circuits and configured to select one segment buffer circuit of the plurality of segment buffer circuits. In yet another example of this embodiment, the memory cell strings may be NAND memory cell strings. In yet another example of this embodiment, the multiple bit information storing memory cells may be multiple bit information storing charge storing memory cells. In yet another example of this embodiment, at least some data storing elements of the plurality of buffer circuits may be configured (e.g., coupled with each other) and operated as a shift register.

In another embodiment, an integrated circuit having a memory cell arrangement is provided. The memory cell arrangement may include a plurality of multiple bit information storing memory cells, a plurality of buffer circuits, each buffer circuit being coupled to at least one multiple bit information storing memory cell of the plurality of multiple bit information storing memory cells, and a controller configured to control an access operation to access at least one multiple bit information storing memory cell in a plurality of partial access operations, wherein data of a partial access operation of the access operation to access at least one multiple bit information storing memory cell is stored in at least one other buffer circuit being coupled to at least one other multiple bit information storing memory cell during another partial access operation of the access operation.

In an example of this embodiment, the multiple bit information storing memory cells may be configured as multi-level memory cells. In another example of this embodiment, the multiple bit information storing memory cells may be configured as multi-bit memory cells. In yet another example of this embodiment, the buffer circuits may be configured as page buffer circuits. In yet another example of this embodiment, each buffer circuit of the plurality of buffer circuits may include an analog-to-digital converter and a data storing element. In yet another example of this embodiment, the controller may be configured to control an access operation to access at least one multiple bit information storing memory cell in a plurality of partial access operations, wherein data of a partial access operation of the access operation to access at least one multiple bit information storing memory cell is stored in at least one data storing element of the other buffer circuit being coupled to at least one other multiple bit information storing memory cell during another partial access operation of the access operation. In yet another example of this embodiment, the access operation is an access operation selected from a group of access operations consisting of: a read operation, a program operation, an inhibit operation, and an erase operation. In yet another example of this embodiment, the plurality of multiple bit information storing memory cells may be grouped in a plurality of memory cell strings of serially source-to-drain-coupled memory cells, and may be arranged in a plurality of memory cell segments on or in a substrate, wherein each memory cell segment of the plurality of memory cell segments may include a plurality of multiple bit information storing memory cells and a plurality of segment buffer circuits, wherein each segment buffer circuit may be assigned to at least one memory cell string of the memory cell segment, wherein the memory cell arrangement may further include at least one global control line, and wherein the at least one global control line may be connected to segment buffer circuits of different memory cell segments of the plurality of memory cell segments. In yet another example of this embodiment, the integrated circuit may further include at least one segment multiplexer coupled with a plurality of segment buffer circuits and configured to select one segment buffer circuit of the plurality of segment buffer circuits. In yet another example of this embodiment, the memory cell strings may be NAND memory cell strings. In yet another example of this embodiment, the multiple bit information storing memory cells may be multiple bit information storing charge storing memory cells. In yet another example of this embodiment, at least some data storing elements of the plurality of buffer circuits may be configured (e.g., coupled with each other) and operated as a shift register.

In yet another embodiment, an integrated circuit having a memory cell arrangement is provided. The memory cell arrangement may include a substrate, a plurality of NAND Flash memory cell segments on or in the substrate, each NAND Flash memory cell segment of the plurality of NAND Flash memory cell segments including a plurality of Flash memory cells and a plurality of buffer circuits, each buffer circuit being assigned to at least one NAND memory cell string of the NAND Flash memory cell segment, and at least one global control line. The at least one global control line may be connected to page buffer circuits of different NAND Flash memory cell segments of the plurality of NAND Flash memory cell segments.

In an example of this embodiment, the integrated circuit may further include a controller configured to control an access operation to access at least one memory cell using the buffer circuit coupled to the at least one memory cell of a NAND Flash memory cell segment of the plurality of NAND Flash memory cell segments. In another example of this embodiment, the Flash memory cells may be multiple bit information storing Flash memory cells, and the controller may further be configured to control the access operation to access at least one multiple bit information storing Flash memory cell using the buffer circuit coupled to the at least one multiple bit information storing Flash memory cell to be accessed, and at least one other multiple bit information storing Flash memory cell being coupled to at least one other multiple bit information storing Flash memory cell. In yet another example of this embodiment, the multiple bit information storing memory cells may be configured as multi-level memory cells. In yet another example of this embodiment, the multiple bit information storing memory cells may be configured as multi-bit memory cells. In yet another example of this embodiment, the buffer circuits may be configured as page buffer circuits. In yet another example of this embodiment, each buffer circuit of the plurality of buffer circuits may include an analog-to-digital converter and a data storing element. In yet another example of this embodiment, the Flash memory cells may be multiple bit information storing Flash memory cells. In yet another example of this embodiment, the controller may be configured to control the access operation to access at least one multiple bit information storing Flash memory cell using the buffer circuit coupled to the at least one multiple bit information storing Flash memory cell to be accessed, and the data storing element of at least one other multiple bit information storing Flash memory cell being coupled to at least one other multiple bit information storing Flash memory cell. In yet another example of this embodiment, the access operation may be an access operation selected from a group of access operations consisting of: a read operation, a program operation, an inhibit operation, and an erase operation. In yet another example of this embodiment, the plurality of multiple bit information storing Flash memory cells may be grouped in a plurality of Flash memory cell strings of serially source-to-drain-coupled Flash memory cells, and may be arranged in a plurality of Flash memory cell segments on or in a substrate. Each Flash memory cell segment of the plurality of Flash memory cell segments may include a plurality of multiple bit information storing Flash memory cells and a plurality of segment buffer circuits, wherein each segment buffer circuit may be assigned to at least one Flash memory cell string of the Flash memory cell segment. The memory cell arrangement may further include at least one global control line. The at least one global control line may be connected to segment buffer circuits of different Flash memory cell segments of the plurality of Flash memory cell segments. In yet another example of this embodiment, the integrated circuit may further include at least one segment multiplexer coupled with a plurality of segment buffer circuits and configured to select one segment buffer circuit of the plurality of segment buffer circuits. In yet another example of this embodiment, the Flash memory cell strings may be NAND Flash memory cell strings. In yet another example of this embodiment, the multiple bit information storing Flash memory cells may be multiple bit information storing charge storing Flash memory cells. In yet another example of this embodiment, at least some data storing elements of the plurality of buffer circuits may be configured (e.g., coupled with each other) and operated as a shift register.

In yet another embodiment, a method for operating an integrated circuit having a memory cell arrangement is provided. The method may include carrying out an access operation to access at least one multiple bit information storing memory cell using a buffer circuit coupled to the at least one multiple bit information storing memory cell to be accessed, and during the access operation, storing access operation information in a buffer circuit of at least one other multiple bit information storing memory cell being coupled to at least one other multiple bit information storing memory cell.

In an example of this embodiment, the multiple bit information storing memory cells may be configured as multi-level memory cells. In another example of this embodiment, the multiple bit information storing memory cells may be configured as multi-bit memory cells. In yet another example of this embodiment, the buffer circuits may be configured as page buffer circuits. In yet another example of this embodiment, each buffer circuit of the plurality of buffer circuits may include an analog-to-digital converter and a data storing element. In yet another example of this embodiment, during the access operation, the access operation information may be stored in a data storing element of the buffer circuit of at least one other multiple bit information storing memory cell being coupled to at least one other multiple bit information storing memory cell. In yet another example of this embodiment, the access operation may be an access operation selected from a group of access operations consisting of: a read operation, a program operation, an inhibit operation, and an erase operation. In yet another example of this embodiment, the multiple bit information storing memory cells may be multiple bit information storing charge storing memory cells. In yet another example of this embodiment, at least some data storing elements of the plurality of buffer circuits may be configured (e.g., coupled with each other) and operated as a shift register.

In yet another embodiment, a method for operating an integrated circuit having a memory cell arrangement is provided. The method may include controlling an access operation to access at least one multiple bit information storing memory cell in a plurality of partial access operations, wherein data of a partial access operation of the access operation to access at least one multiple bit information storing memory cell is stored in at least one other buffer circuit being coupled to at least one other multiple bit information storing memory cell during another partial access operation of the access operation.

In an example of this embodiment, the multiple bit information storing memory cells may be configured as multi-level memory cells. In another example of this embodiment, the multiple bit information storing memory cells may be configured as multi-bit memory cells. In yet another example of this embodiment, the buffer circuits may be configured as page buffer circuits. In yet another example of this embodiment, each buffer circuit of the plurality of buffer circuits may include an analog-to-digital converter and a data storing element. In yet another example of this embodiment, the access operation to access at least one multiple bit information storing memory cell in a plurality of partial access operations may be controlled such that data of a partial access operation of the access operation to access at least one multiple bit information storing memory cell is stored in at least one data storing element of the other buffer circuit being coupled to at least one other multiple bit information storing memory cell during another partial access operation of the access operation. In yet another example of this embodiment, the access operation may be an access operation selected from a group of access operations consisting of: a read operation, a program operation, an inhibit operation, and an erase operation. In yet another example of this embodiment, the multiple bit information storing memory cells may be multiple bit information storing charge storing memory cells. In yet another example of this embodiment, at least some data storing elements of the plurality of buffer circuits may be configured (e.g. coupled with each other) and operated as a shift register.

Figure 13A:
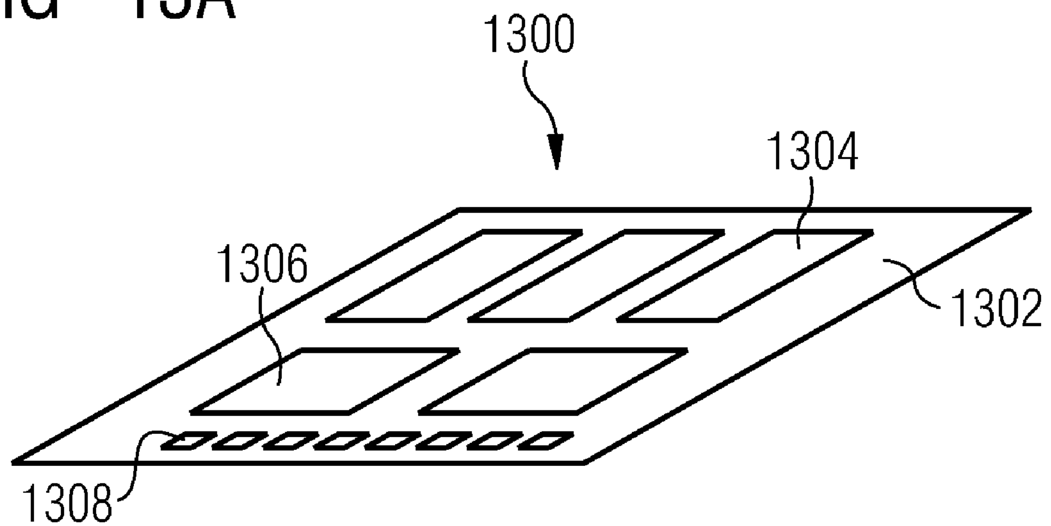
FIGS. 13A and 13B show a memory module (FIG. 13A) and a stackable memory module (FIG. 13B) in accordance with an embodiment.
Figure 13B:
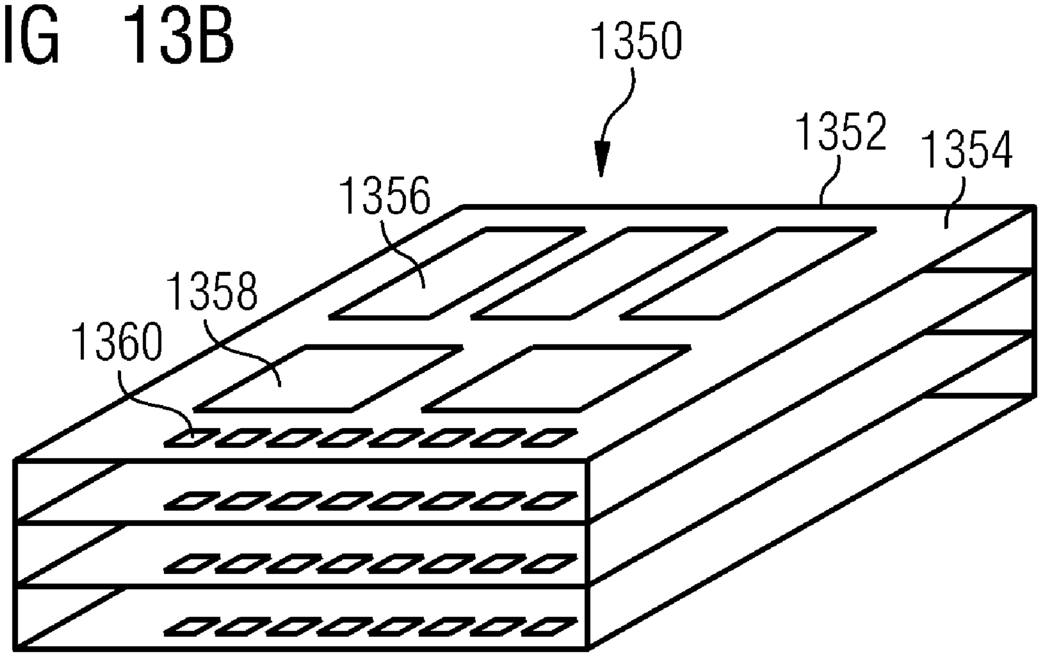

As shown in FIGS. 13A and 13B, in some embodiments, memory devices such as those described herein may be used in modules.

In FIG. 13A, a memory module 1300 is shown, on which one or more memory devices 1304 are arranged on a substrate 1302. The memory device 1304 may include numerous memory cells, each of which uses a memory element in accordance with an embodiment. The memory module 1300 may also include one or more electronic devices 1306, which may include memory, processing circuitry, control circuitry, addressing circuitry, bus interconnection circuitry, or other circuitry or electronic devices that may be combined on a module with a memory device, such as the memory device 1304. Additionally, the memory module 1300 includes multiple electrical connections 1308, which may be used to connect the memory module 1300 to other electronic components, including other modules.

As shown in FIG. 13B, in some embodiments, these modules may be stackable, to form a stack 1350. For example, a stackable memory module 1352 may contain one or more memory devices 1356, arranged on a stackable substrate 1354. The memory device 1356 contains memory cells that employ memory elements in accordance with an embodiment. The stackable memory module 1352 may also include one or more electronic devices 1358, which may include memory, processing circuitry, control circuitry, addressing circuitry, bus interconnection circuitry, or other circuitry or electronic devices that may be combined on a module with a memory device, such as the memory device 1356. Electrical connections 1360 are used to connect the stackable memory module 1352 with other modules in the stack 1350, or with other electronic devices. Other modules in the stack 1350 may include additional stackable memory modules, similar to the stackable memory module 1352 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising a memory cell arrangement, the memory cell arrangement comprising:

a plurality of multiple bit information storing memory cells;

a plurality of buffer circuits, each buffer circuit being coupled to at least one multiple bit information storing memory cell of the plurality of multiple bit information storing memory cells; and a controller configured to control an access operation to access at least one multiple bit information storing memory cell using the buffer circuit coupled to the at least one multiple bit information storing memory cell to be accessed and a buffer circuit of at least one other multiple bit information storing memory cell being coupled to at least one other multiple bit information storing memory cell;

wherein each buffer circuit of the plurality of buffer circuits comprises an analog-to-digital converter coupled to a data storing element.

2. The integrated circuit of claim 1, wherein the multiple bit information storing memory cells are configured as multi-level memory cells.

3. The integrated circuit of claim 1, wherein the multiple bit information storing memory cells are configured as multi-bit memory cells.

4. The integrated circuit of claim 1, wherein the buffer circuits are configured as page buffer circuits.

5. The integrated circuit of claim 1, wherein the controller is configured to control the access operation to access at least one multiple bit information storing memory cell using the buffer circuit coupled to the at least one multiple bit information storing memory cell to be accessed and the data storing element of at least one other multiple bit information storing memory cell being coupled to at least one other multiple bit information storing memory cell.

6. The integrated circuit of claim 1, wherein the access operation comprises an access operation selected from the group consisting of:

a read operation;

a program operation;

an inhibit operation; and an erase operation.

7. An integrated circuit comprising a memory cell arrangement, the memory cell arrangement comprising:

a plurality of multiple bit information storing memory cells;

a plurality of buffer circuits, each buffer circuit being coupled to at least one multiple bit information storing memory cell of the plurality of multiple bit information storing memory cells; and a controller configured to control an access operation to access at least one multiple bit information storing memory cell using the buffer circuit coupled to the at least one multiple bit information storing memory cell to be accessed and a buffer circuit of at least one other multiple bit information storing memory cell being coupled to at least one other multiple bit information storing memory cell;

wherein the plurality of multiple bit information storing memory cells are grouped in a plurality of memory cell strings of serially source-to-drain-coupled memory cells and are arranged in a plurality of memory cell segments on or in a substrate;

wherein each memory cell segment of the plurality of memory cell segments comprises a plurality of multiple bit information storing memory cells and a plurality of segment buffer circuits, wherein each segment buffer circuit is assigned to at least one memory cell string of the memory cell segment;

wherein the memory cell arrangement further comprises at least one global control line; and wherein the at least one global control line is connected to segment buffer circuits of different memory cell segments of the plurality of memory cell segments.

8. The integrated circuit of claim 7, further comprising:

at least one segment multiplexer coupled with a plurality of segment buffer circuits and configured to select one segment buffer circuit of the plurality of segment buffer circuits.

9. The integrated circuit of claim 7, wherein the memory cell strings are NAND memory cell strings.

10. The integrated circuit of claim 1, wherein the multiple bit information storing memory cells are multiple bit information storing charge storing memory cells.

11. An integrated circuit comprising a memory cell arrangement, the memory cell arrangement comprising:

a plurality of multiple bit information storing memory cells;

a plurality of buffer circuits, each buffer circuit being coupled to at least one multiple bit information storing memory cell of the plurality of multiple bit information storing memory cells; and a controller configured to control an access operation to access at least one multiple bit information storing memory cell using the buffer circuit coupled to the at least one multiple bit information storing memory cell to be accessed and a buffer circuit of at least one other multiple bit information storing memory cell being coupled to at least one other multiple bit information storing memory cell;

wherein at least some data storing elements of the plurality of buffer circuits are operated as a shift register.

* * * * *